(12) United States Patent
Merz et al.

(10) Patent No.: US 7,301,761 B2
(45) Date of Patent: Nov. 27, 2007

(54) COMPUTER COMPONENT PROTECTION

(75) Inventors: Nick Merz, San Carlos, CA (US); John DiFonzo, Emerald Hill, CA (US); Michael Prichard, Oakland, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 11/336,102

(22) Filed: Jan. 19, 2006

(65) Prior Publication Data

US 2006/0120035 A1 Jun. 8, 2006

Related U.S. Application Data

(62) Division of application No. 11/002,484, filed on Dec. 1, 2004, now Pat. No. 7,019,967, which is a division of application No. 09/842,408, filed on Apr. 24, 2001, now Pat. No. 6,900,984.

(51) Int. Cl.
*G06F 1/16* (2006.01)

(52) U.S. Cl. ........................................ 361/681; 248/694

(58) Field of Classification Search ................. 361/681
See application file for complete search history.

(56) References Cited

U.S. PATENT DOCUMENTS

| | | | |
|---|---|---|---|
| 4,015,808 A | 4/1977 | Carroll | |
| 4,713,714 A | 12/1987 | Gatti et al. | |
| 5,002,368 A * | 3/1991 | Anglin | ........................ 349/60 |
| 5,084,855 A | 1/1992 | Kobayashi et al. | |
| 5,156,371 A | 10/1992 | Samarov | |
| 5,164,542 A | 11/1992 | Hart | |
| 5,237,486 A | 8/1993 | LaPointe et al. | |
| 5,309,983 A | 5/1994 | Bailey | |
| 5,339,214 A | 8/1994 | Nelson | |
| 5,406,451 A | 4/1995 | Korinsky | |
| 5,486,942 A * | 1/1996 | Ichikawa et al. | .............. 349/58 |
| 5,568,357 A * | 10/1996 | Kochis et al. | .............. 361/681 |
| 5,568,360 A | 10/1996 | Penniman et al. | |
| 5,598,320 A | 1/1997 | Toedtman et al. | |
| 5,659,376 A * | 8/1997 | Uehara et al. | ................ 349/58 |
| 5,673,176 A | 9/1997 | Penniman et al. | |

(Continued)

FOREIGN PATENT DOCUMENTS

JP 411143585 5/1999

OTHER PUBLICATIONS

Panasonic "Toughbook 28" www.panasonic.com/computer/notebook/html/01a_s8.htm, Nov. 2, 2001.

*Primary Examiner*—Lisa Lea-Edmonds
(74) *Attorney, Agent, or Firm*—Beyer Weaver LLP

(57) ABSTRACT

A computing device is disclosed. The computing device includes a shock mount assembly that is configured to provide impact absorption to sensitive components such as a display and an optical disk drive. The computing device also includes an enclosureless optical disk drive that is housed by an enclosure and other structures of the computing device. The computing device further includes a heat transfer system that removes heat from a heat producing element of the computing device. The heat transfer system is configured to thermally couple the heat producing element to a structural member of the computing device so as to sink heat through the structural member, which generally has a large surface area for dissipating the heat.

29 Claims, 8 Drawing Sheets

U.S. PATENT DOCUMENTS

| | | | |
|---|---|---|---|
| 5,712,762 A | 1/1998 | Webb | |
| 5,715,139 A | 2/1998 | Nakajima | |
| 5,784,256 A | 7/1998 | Nakamura et al. | |
| 5,793,920 A | 8/1998 | Wilkins et al. | |
| 5,801,922 A | 9/1998 | Shen et al. | |
| 5,818,693 A | 10/1998 | Garner et al. | |
| 5,822,187 A | 10/1998 | Garner et al. | |
| 5,829,515 A | 11/1998 | Jeffries et al. | |
| 5,831,816 A * | 11/1998 | Johns et al. | 361/681 |
| 5,838,400 A * | 11/1998 | Ueda et al. | 349/58 |
| 5,964,279 A | 10/1999 | Mochizuki et al. | |
| 5,966,286 A | 10/1999 | O'Connor et al. | |
| 5,973,920 A | 10/1999 | Altic et al. | |
| 6,049,453 A | 4/2000 | Hulsebosch | |
| 6,061,231 A * | 5/2000 | Crockett | 361/681 |
| 6,072,664 A | 6/2000 | Aoyagi et al. | |
| 6,088,223 A | 7/2000 | Diemunsch | |
| 6,094,343 A | 7/2000 | Nakagawa et al. | |
| 6,122,164 A | 9/2000 | Liao et al. | |
| 6,122,167 A | 9/2000 | Smith et al. | |
| 6,125,035 A | 9/2000 | Hood, III et al. | |
| 6,144,552 A * | 11/2000 | Whitcher et al. | 361/681 |
| 6,151,207 A * | 11/2000 | Kim | 361/681 |
| 6,157,538 A | 12/2000 | Ali et al. | |
| 6,178,084 B1 | 1/2001 | Shibasaki | |
| 6,205,025 B1 | 3/2001 | Chen | |
| 6,208,506 B1 | 3/2001 | Pao | |
| 6,324,054 B1 | 11/2001 | Chee et al. | |
| 6,366,463 B2 | 4/2002 | Hamano | |
| 6,392,876 B1 | 5/2002 | Ramonowski | |
| 6,392,880 B1 | 5/2002 | Forlenza et al. | |
| 6,404,627 B1 | 6/2002 | Tanaka et al. | |
| 6,418,017 B1 | 7/2002 | Patel et al. | |
| 6,424,338 B1 | 7/2002 | Anderson | |
| 6,456,491 B1 | 9/2002 | Flannery et al. | |
| 6,487,073 B2 | 11/2002 | McCullough et al. | |
| 6,509,981 B1 | 1/2003 | Shih | |
| 6,532,152 B1 * | 3/2003 | White et al. | 361/692 |
| 6,542,359 B2 | 4/2003 | Babcock et al. | |
| 6,549,414 B1 | 4/2003 | Tokuhara et al. | |
| 6,606,132 B2 * | 8/2003 | Giannatto | 349/58 |
| 6,795,310 B2 | 9/2004 | Ghosh | |

* cited by examiner

COMPUTER COMPONENT PROTECTION

CROSS REFERENCE TO RELATED APPLICATIONS

This application is a divisional of U.S. patent application Ser. No. 11/002,484, entitled "COMPUTER COMPONENT PROTECTION", filed Dec. 1, 2004 now U.S. Pat. No. 7,019,967 which, in turn, is a divisional of U.S. Patent application Ser. No. 09/842,408 filed Apr. 24, 2001, now U.S. Pat. No. 6,900,984, entitled "COMPUTER COMPONENT PROTECTION" issued May 31, 2005, which are both incorporated herein by reference.

BACKGROUND OF THE INVENTION

The present invention relates generally to a computer device. More particularly, the present invention relates to arrangements for protecting key components of the computing device.

Portable computers generally consist of a lid for carrying a display screen and a base for carrying various internal and external components used for operating the portable computer. By way of example, the internal components may be a hard drive, a modem, a processor, a disk drive, memory and the like, and the external components may be a keyboard, a track pad, buttons and the like.

In recent years, sensitive components, such as CD/DVD drives and LCD displays, have been incorporated into the portable computer. By sensitive, it is meant that the CD/DVD drives and LCD displays are some of the most fragile components of the portable computer in terms of sensitivity to impact. The CD/DVD drive generally includes drive components for reading a compact disc (CD) and/or a digital video disc (DVD) and transport components for inserting and removing the CD and DVD discs to and from the drive components. By way of example, the drive components may include a laser, light sensing diode, and a spindle motor, and the transport components may include a movable tray. The LCD display, on the other hand, uses glass substrates with transparent electrodes and a liquid crystal material placed in a gap between the electrodes. The LCD also uses sophisticated driving circuitry (e.g., integrated circuit) for energizing selected segments of the LCD to create the desired image.

Unfortunately, the manner in which the LCD and CD/DVD drive are mounted offers little protection against damage, as for example, damage that is due to dropping or other day-to-day handling of the portable computer. Each of these components is rigidly mounted in the base or lid and thus they are susceptible to damage when the portable computer, and more particularly the base and lid, feels an impact. Conventionally, the LCD display and the CD/DVD drive have been rigidly mounted to a structural component of the lid and base, respectively, via a fastener such as a screw or bolt. As such, when a portable computer is dropped, the force of impact is typically transferred from the base to the CD/DVD drive and from the lid to the LCD display through the fastening device. Further, as portable computers become smaller, their associated compact structures have even less damage prevention capability. That is, the fragile LCD and CD/DVD drive are more vulnerable to damage as the size of the computer decreases.

Other sensitive components have included a hard drive. In most cases, the hard drive is mounted in the portable computer using similar techniques as those given above with regards to the LCD and CD/DVD drive. However, in some portable computers, the hard drive is mounted using a shock mounting system that reduces shocks thereto. By way of example, the shock mounting system may include a rubberized grommet and bolt that cooperate to couple the hard drive to a metal bracket attached to the housing of the portable computer. The grommet is typically disposed within an opening in the metal bracket and the bolt is typically disposed within an opening in the grommet while being attached to the hard drive.

The CD/DVD drive also includes an enclosure for housing the drive and transport components. The enclosure is typically arranged to structurally support the components, to shield electronic and laser emissions therein, and to prevent dust particles from reaching the drive components. In most cases, the CD/DVD drive, including its own enclosure, is installed into the base of the portable computer. By way of example, the enclosure may be permanently installed in the base via a fastener, or removably installed in the base via a mating structure built into the base.

Unfortunately, the technique of installing the CD/DVD enclosure into the base leads to redundant features. That is, the drive components are disposed inside a double box, i.e., an enclosure inside an enclosure, and therefore they have double features that serve the same purpose, as for example, structural support, shielding, dust protection, and the like. While double protection may sound good, the double box tends to add unnecessary mass, volume, and expense to the portable computer. These are undesirable traits that go against the current trend to make the portable computer cheaper, thinner and lighter. The extra layer of material may also inhibit the dissipation of heat from the drive components, which can be a major source of heat in the portable computer. As should be appreciated, too much heat can lead to failures in the operation of the CD/DVD drive.

As is generally well known, the CD/DVD drive is not the only source of heat inside the base. Processor chips and other electronic components of the personal computers also generate significant amounts of heat in operation. Advances in processor speed and bus throughput have further compounded this problem. As such, the portable computer generally includes a system for transferring heat away from these various chips and electronic components. By way of example, a fan may be provided to thermally manage the internal components by forcing air through the base. Individual components, such as the processor chip, can also have a heat sink attached thereto for dissipating heat generated by the component. A heat sink is generally made of metal and includes a plurality of outward-extending fins. The metal fins are generally configured to remove heat from the processor chip by means of conduction, convection and radiation. In some cases, the processor chip may be cooled by a fan and heat sink combination.

While fans and heat sinks provide effective mechanisms for thermally managing many types of computer systems, the fan typically generates undesirable noise and requires an undesirable amount of power. Excess amounts of noise generally lead to user dissatisfaction, and excess amounts of power unduly draw upon the batteries of a portable computer making it unattractive for long periods of battery-operated use. As should be appreciated, larger fans that provide the greatest amount of cooling tend to produce a greater amount of noise, and use a greater amount of power.

In many instances it would be desirable to provide portable computers that are cost effective, thinner, lighter, stronger and aesthetically more pleasing than current portable computers. It would also be desirable to provide impact shock protection for sensitive components such as CD/DVD drives and/or LCD displays and a thermal management system that is superior to conventional fans and heat sinks.

SUMMARY OF THE INVENTION

The invention relates, in one embodiment, to a computing device. The computing device includes an LCD display. The computing device further includes an LCD housing configured to cover at least a portion of the LCD display. The computing device additionally includes a shock mount assembly configured to reduce impacts to the LCD display, and to position the LCD display relative to the LCD housing. The shock mount assembly includes a plurality of shock mounts, which are attached to the LCD display, and which rest in a portion of the LCD housing.

The invention relates, in another embodiment, to a portable computer. The portable computer includes a structural member configured to support the portable computer. The portable computer further includes an optical disk drive including drive components and structural components configured to support the drive components. The portable computer additionally includes a shock mount assembly configured to reduce impacts to the optical disk drive, and to position the optical disk drive relative to the structural member. The shock mount assembly includes a plurality of shock mounts, which are attached to the structural components of the optical disk drive, and which rest in a portion of the structural member.

The invention relates, in another embodiment, to a portable computer. The portable computer includes a base having casing and a chassis. The casing is configured to house various components that provide computing operations for the portable computer. The chassis is configured to support the casing. The casing and chassis has interior portions that define an enclosed region inside the base. The portable computer further includes an enclosureless optical disc drive having drive components and frame components configured to support the drive components. The enclosureless optical disc drive is disposed inside the enclosed region of the base. The enclosed region is arranged to surround a substantial portion of the enclosureless optical disc drive so as to shield the enclosureless optical disc drive from internal and external hazards.

The invention relates, in another embodiment, to a portable computer having an enclosure. The portable computer includes a structural member associated with the enclosure. The portable computer further includes a heat producing element disposed inside the enclosure. The portable computer additionally includes a heat exchanger configured to thermally couple the heat producing element to the structural member, whereby the heat from the heat producing element is spread throughout the structural member via the heat exchanger.

BRIEF DESCRIPTION OF THE DRAWINGS

The invention may best be understood by reference to the following description taken in conjunction with the accompanying drawings in which.

DETAILED DESCRIPTION OF THE INVENTION

The invention generally pertains to a computing device. More particularly, the invention pertains to arrangements for protecting key components of the computing device. One aspect of the invention pertains to shock mount arrangements that provide impact absorption to sensitive components. In one embodiment, a shock mount assembly is used to support a LCD display. In another embodiment, a shock mount assembly is used to support an optical disk drive such as a CD/DVD drive. Another aspect of the invention pertains to an enclosureless optical disk drive such as an enclosureless CD/DVD drive. By enclosureless, it is meant that the optical disk drive does not include its own housing. In one embodiment, the enclosure and other structures of the computing device are used to house an enclosureless optical disk drive. Another aspect of the invention pertains to a heat transfer system that removes heat from a heat producing element of the computing device. In one embodiment, the heat transfer system is configured to thermally couple a heat producing element to a structural member of the computing device so as to sink heat through the structural member, which generally has a large surface area for dissipating the heat. By way of example, the heat producing element may be an integrated circuit such as a processor chip and the structural member may be a frames, chassises, casings and/or the like. The invention is particularly useful in computing devices such as portable computers (e.g., laptops, notebooks).

Embodiments of the invention are discussed below with reference to FIGS. 1-9. However, those skilled in the art will readily appreciate that the detailed description given herein with respect to these figures is for explanatory purposes as the invention extends beyond these limited embodiments.

Figure 1:
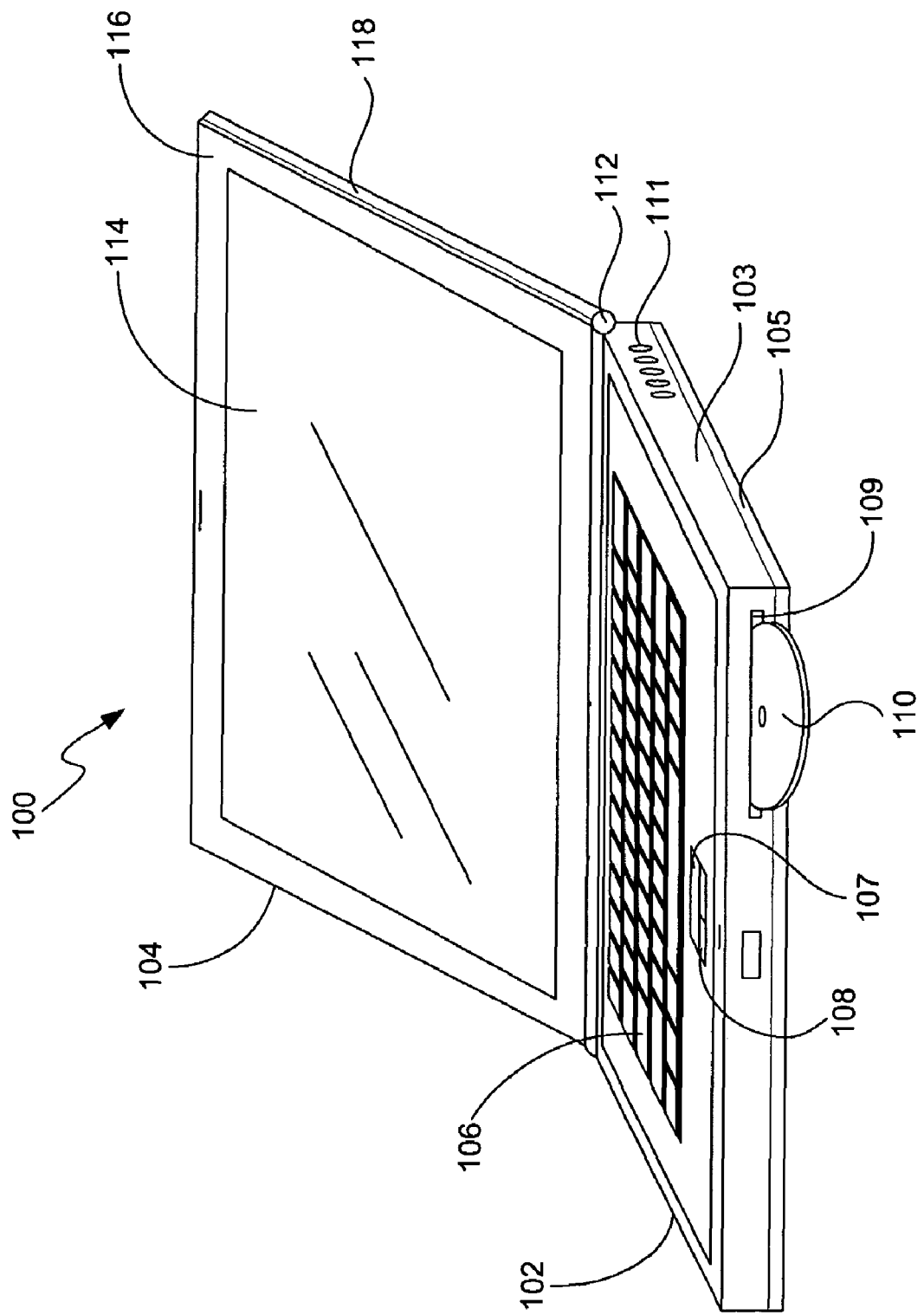
FIG. 1 is a perspective diagram of a portable computer, in accordance with one embodiment of the present invention.

FIG. 1 is a perspective diagram of a portable computer 100, in accordance with one embodiment of the invention. The portable computer 100 generally includes a base 102 and a lid 104. The base 102 is configured to enclose various integrated circuit chips and other circuitry that provide computing operations for the portable computer 100. By way of example, the integrated circuit chips and other circuitry may include a microprocessor, Read-Only Memory (ROM), Random-Access Memory (RAM), a disk drive(s), a battery, and various input/output support devices. The base 102 is also configured to enclose various structural members for supporting the base 102. For example, the structural members may include ribs, bars, frames and the like.

The internal components of the base 102 are generally surrounded at a peripheral region by a top case 103 and a bottom case 105 that serve to support the internal components in their assembled position within the base 102. In some instances, the integrated circuit chips and other circuitry may generate unwanted electrical emissions (EMI), and therefore, the top and bottom cases 103 and 105, may be configured to contain electronic emissions therein. By way of example, the inner surfaces of the top and bottom cases may be formed from a suitable shielding material, i.e., a conductive material and/or a non-conductive material coated with a conductive material. In other instances, the integrated circuit chips and other circuitry may generate undesirable heat, and therefore, the top case 103 and a bottom case 105, may be configured to disperse the heat. By way of example, the top case 103 may include a vent structure 111 that is part of a heat removal system housed within the base 102. In one embodiment, the top case 103 is integrated with a heat transfer system that is arranged to transfer heat away from a heat producing element through portions of the top case 103. This embodiment will be described in greater detail below.

The base 102 is also arranged to hold a plurality of input devices such as a keyboard 106, a track pad 107 and button(s) 108. The keyboard 106, which includes a plurality of keys, allows a user of the portable computer 100 to enter alphanumeric data. The track pad 107 allows a user to move an input pointer on a graphical user interface. Button(s) 108 allows a user to make a selection on the graphical user interface. As shown, the track pad 107 and button(s) 108 are located in a front portion (or palm rest) of the base 102, and the keyboard 106 is located in a back portion of the base 102.

In one embodiment, the keyboard 106 is arranged to be a modular unit that is movable relative to the base 102. That is, the keyboard 106 is movable such that it can be coupled to and/or de-coupled from the base 102. In one implementation, the movable keyboard is arranged to act as a trap door that covers an opening in the base. The opening allows user access to various internal components enclosed inside the base. As such, the keyboard 106 is adapted to move between a mounting condition, which secures the keyboard to the base and which prevents access through the opening, and a removal condition, which enables removal of the keyboard from the base and which allows access through the opening. By way of example, a movable keyboard system, which may be used in the portable computer 100, may be found in U.S. patent application Ser. No. 09/405,552, filed on Sep. 24, 1999, and U.S. patent application Ser. No. 09/755,625, filed on Jan. 4, 2001, both of which are herein incorporated by reference.

The base 102 is also arranged to hold a disk drive for performing various functions related to the portable computer. By way of example, the disk drive may be an optical disc drive configured to work with optical discs such as CD's (e.g., CD, CDR, CD-RW, Video CD), DVD's (e.g., DVD, DVD-audio, DVD-video, DVD-RW), mini-discs, magneto-optical discs and the like. In the illustrated embodiment, the disk drive is a slot loaded CD/DVD drive. By slot loaded, it is meant that the CD or DVD is inserted directly into the drive rather than by an external retractable tray that moves in and out of the drive. As such, the base 102 generally includes a disk opening 109 that allows a disk 110 to be placed in the disk drive housed within the base 102. In most cases, the disk drive opening 109 is located in a front portion (or palm rest) of the base 102. By way of example, the slot loaded CD/DVD drive may include an internal lock and release mechanism for holding the inserted CD or DVD disc, an internal conveying roller for conveying the CD or DVD disc, an internal CD/DVD detector for detecting the presence of a CD or DVD disc in the disk opening 109, and a controller for actuating the conveying roller to load the CD or DVD disc when the CD/DVD detector detects the CD or DVD disc present in the disk opening 109. It should be noted, however, that the present invention is not limited by a slot loaded CD/DVD drive and that other types of disc drives may be used, i.e., standard CD or DVD drives having trays, other optical disk drives and/or floppy disc drives.

In one embodiment, the CD/DVD drive is an enclosureless CD/DVD drive having only a skeletal support structure for holding the drive components of the CD/DVD drive. In another embodiment, the CD/DVD drive is shock mounted relative to the base so as to absorb shocks thereto. These embodiments will be described in greater detail below.

Referring now to the lid 104, the lid 104 is pivotally coupled to the base 102 via a hinge mechanism 112. As such, the lid 104 may rotate into an open position (as shown) or a closed position (not shown) relative to the base 102. The hinge mechanism 112 is generally configured to hold the lid 104 relative to the base 102. In one implementation, the hinge mechanism 112 includes a spring element configured for continuously exerting a biasing force on the lid 104 in a direction away from the base 102. In another implementation, the hinge mechanism 112 includes a clutch or cam device configured for exerting a frictional force on the lid 104 so as to maintain the position of the lid 104 when the lid 104 is moved to a desired open position.

The lid 104 generally contains a liquid crystal display (LCD) 114 that is used to display the graphical user interface (including perhaps a pointer or cursor) as well as other information to the user. The LCD display 114 is surrounded at a peripheral region by a bezel 116 and a LCD housing 118 that serves to support the LCD display 114 in its assembled position within the lid 104. The bezel 116 and housing 118 may also serve to reduce electronic emissions emanating from within the lid 104. As should be appreciated, the LCD display 114 is visible to a user of the portable computer 100 when the lid 104 is in the open position and no longer visible to the user when the lid 104 is in a closed position. In one embodiment, the LCD display 114 is shock mounted relative to the lid 104 so as to absorb shocks thereto. This embodiment will be described in greater detail below.

Figure 2:
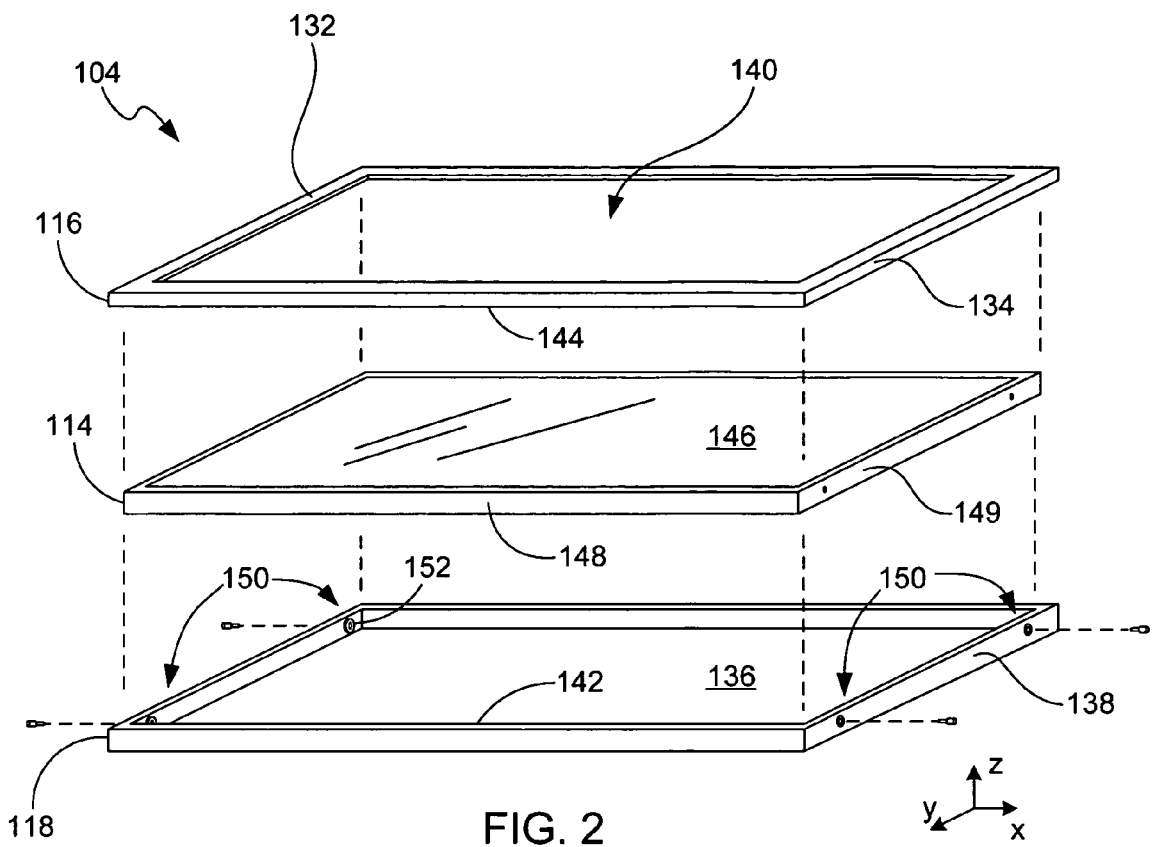
FIG. 2 is a broken away perspective diagram of a lid of a portable computer, in accordance with one embodiment of the present invention.

FIG. 2 is a broken away perspective diagram of the lid 104 including the LCD display 114, bezel 116 and LCD housing 118, in accordance with one embodiment of the present invention. The bezel 116 and a LCD housing 118 are configured for enclosing the LCD display 114 therebetween so as to surround the peripheral regions of the LCD display 114. In the illustrated embodiment, the bezel 116 includes a front cover 132 that is positioned in front of the LCD display 114 and a bezel wall 134 that is positioned around the perimeter of the LCD display 114, and the LCD housing 118 includes a back cover 136 that is positioned behind the back of the LCD display 114 and a housing wall 138 that is positioned around the perimeter of the LCD display 114. The front cover 134 typically includes an opening 140 for allowing a user to see the screen of the LCD display 114, and the back cover 136 typically protects the backside of the LCD display 114 from impacts. In general, the LCD display 114 is mechanically attached to the LCD housing 118, and the bezel 116 is structurally attached to the LCD display 114. By way of example, the LCD housing may be attached to the LCD display via a plurality of screws, and the bezel may be attached to the LCD display via glue.

In their assembled condition (as shown in FIG. 1), the bezel 116 and LCD housing 118 are arranged to form a box like structure that encloses the LCD display 114 (except for the opening 140). In the illustrated embodiment (FIG. 2), the bezel wall 134 extends perpendicularly from the periphery of the front cover 132, and the housing wall 138 extends perpendicularly from the periphery of the back cover 136. The shape of the bezel wall 134 generally coincides with the shape of the housing wall 138 so that a top surface 142 of the housing wall 138 abuts to a bottom surface 144 of the bezel wall 134 when the lid is assembled together. In most cases, the two walls form an enclosure without gaps therebetween. In some instances, the LCD housing 118 provides a greater amount of support to the LCD display 114 and thus the housing wall 138 is configured to be wider than the bezel wall 134. It should be noted, however, that this is not a limitation and that the lengths of the walls may vary according to each enclosure design. Furthermore, when mated, the combined walls create an inner wall that has substantially the same length as the width of the LCD display 114, and an outer wall that is substantially flush or planar, i.e., no lips.

Although not shown, the LCD housing 118 generally includes a housing plate and a housing frame, and the bezel 116 generally includes a bezel plate and a bezel frame. The frames are arranged to structurally support the plates. In one implementation, the plates are formed from a sheet metal such as titanium, and the frames are formed from a plastic material such carbon fiber plastic. The frames are generally arranged to surround the perimeter of the plates, i.e., they may form a portion of the walls. In one implementation, the frames are structurally attached to the plates via a structural glue so as to form a singular composite structure, as for example, the LCD housing 118 and the bezel 116. By way of example, techniques for gluing a frame to a plate may be found in U.S. patent application Ser. No. 09/821,784 entitled "COMPUTER ENCLOSURE," filed on Mar. 28, 2001, which is herein incorporated by reference.

To elaborate further, the LCD display 114 is configured for placement between the bezel 116 and the LCD housing 118. The LCD panel 114 generally includes an LCD panel 146 and an LCD frame 148. The LCD panel 146 is conventional and well known in the art. For example, the LCD panel 146 typically consists of glass substrates with transparent electrodes, a liquid crystal material placed in a gap formed between the electrodes and sophisticated driving circuitry for energizing selected segments of the LCD to create the desired image. On the other hand, the LCD frame 148 is configured to provide structurally support to the LCD panel 146. In the illustrated embodiment, the LCD frame 148 surrounds the periphery of the LCD panel 146, and therefore the LCD frame 148 defines a peripheral side portion 149 of the LCD display 114. In one implementation, the LCD frame 148 is formed from suitable material such as stainless steel and structurally attached to the LCD screen 148 via a structural adhesive.

Still referring to FIG. 2, the housing wall 138 is arranged to receive the LCD frame 148 when the LCD panel 114 is placed within the LCD housing 118. By way of example, the inner periphery of the housing wall 138 typically coincides with the outer periphery of the LCD frame 148. Similarly, the bezel wall 134 is also arranged to receive the LCD frame 148 when the LCD panel 114 is placed within the bezel 116. By way of example, the inner periphery of the bezel wall 134 typically coincides with the outer periphery of the LCD frame 148. A gap may be provided between the housing wall and the LCD frame, as well as between the bezel wall and LCD frame to provide some space for attachment. Furthermore, for cosmetic reasons, the front cover 132 is configured to cover the interface of the LCD panel 146 and the LCD frame 148.

In accordance with one aspect of the present invention, the LCD display 114 is shock mounted to the LCD housing 118 in order to protect the LCD display 114 from forces that may be induced on the portable computer 100. By shock mounted, it is meant that the LCD display 114 is held in a substantially fixed position while absorbing shocks thereto. As mentioned, the LCD display 114 is a fragile component of the portable computer 100. As such, it is very important to protect the LCD display 114 from forces, which may distort, stress or break the LCD display 114. By way of example, the forces may be due to impacts on the LCD housing 118 during transportation of the portable computer 100. A shock mount assembly is thus provided to hold the LCD display 114 and to absorb forces acting on the display so as to reduce stresses on the LCD display 114. In general, the shock mount assembly allows the LCD display 114 to float relative to the LCD housing 118, and cushions the movements of the floating LCD display 114, i.e., the assembly prevents the LCD display 114 from running into an adjacent surface such as the LCD housing 118.

Figure 3:
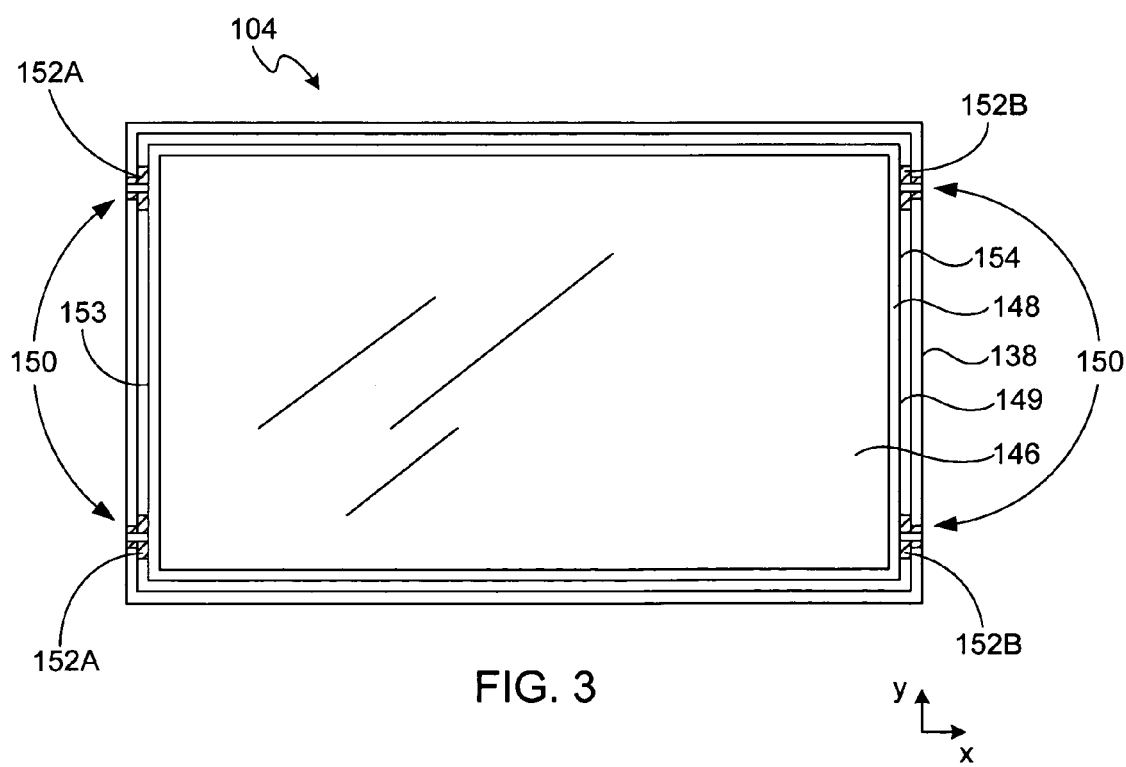
FIG. 3 is a front view, in cross section, of a lid of a portable computer, in accordance with one embodiment of the present invention.
Figure 4:
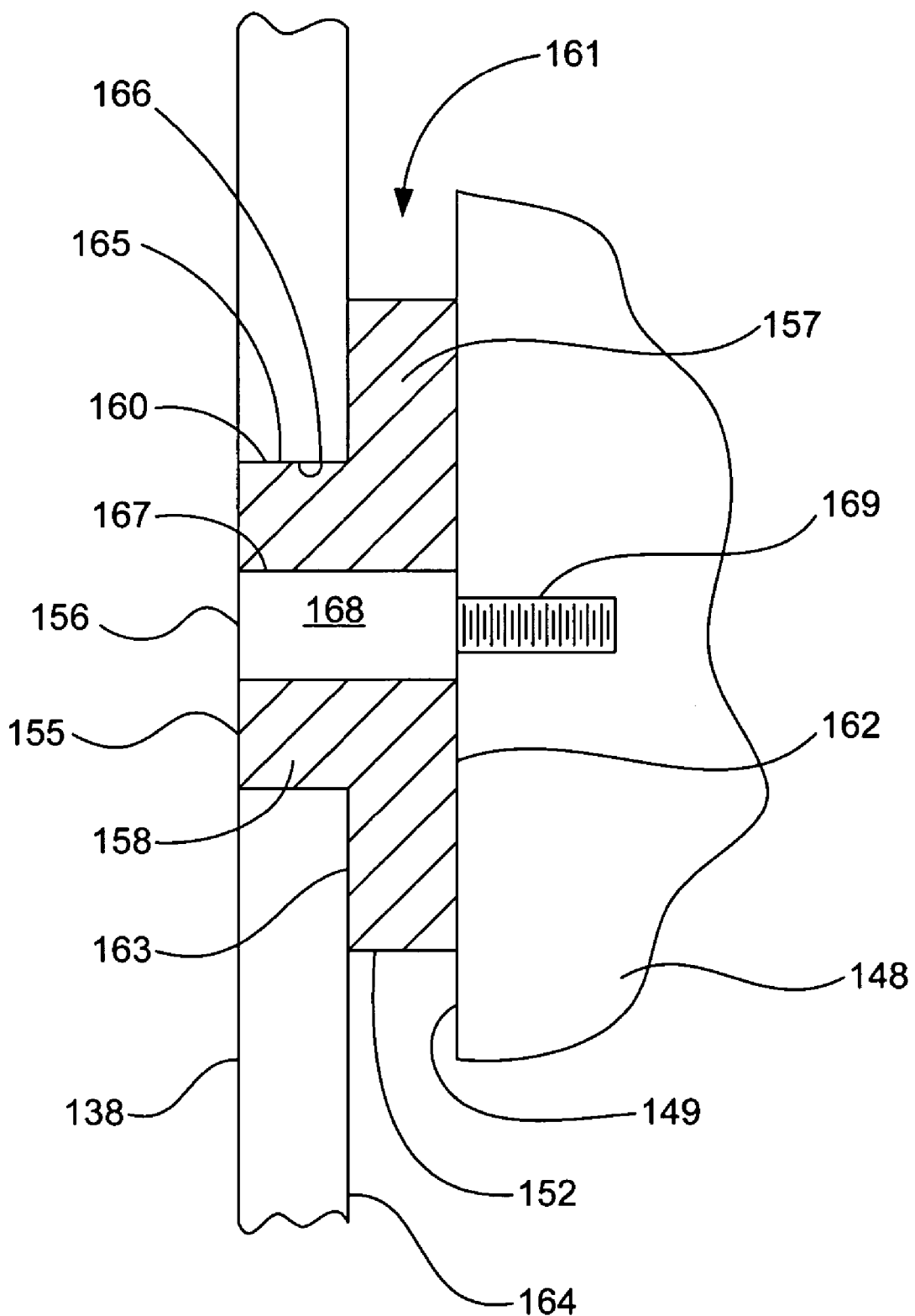
FIG. 4 is a side elevation view, in cross section, of a shock mount used to support a display screen in a lid of a portable computer, in accordance with one embodiment of the present invention.

Referring to FIGS. 2-4, a shock mount assembly 150 is arranged to support the LCD display 114 relative to the LCD housing 118. Broadly, the shock mount assembly 150 allows the display 114 to transfer a load into the most structural sound place in the lid 104, i.e., the LCD housing 118. More particularly, the shock mount assembly 150 provides a non-hysteretic way of supporting the LCD display 114 relative to the LCD housing 118. By non-hysteretic, it is meant, for example, that the shock mount assembly 150 may be altered by an external force while having the ability to return to its original non-altered configuration when the altering force is removed. Accordingly, the LCD display 114 is held in manner that does not distort the LCD display 114. That is, the LCD display 114 is moved (albeit limited) without causing distortions thereto.

To elaborate further, the shock mount assembly 150 includes a plurality of compliant shock mounts 152 that are structurally attached to the LCD display 114 and cooperatively attached to the LCD housing 118. The compliant shock mounts 152 are generally arranged to restrain the display 114 in the X, Y and Z directions. The compliant shock mounts 152 are disposed between the inner periphery of the housing wall 138 and the outer periphery of the LCD display 114. By placing the compliant shock mounts 152 between the display and the housing wall, the shock mounts 152 can compress to compensate for undesirable forces inflicted on the display. That is, the compliant shock mounts are arranged to decelerate the floating LCD display (if it decelerates too fast it can be damaged). By way of example, the shock mounts 152 tend to compress in the X direction when the display 114 floats towards the sides of the housing wall 138, in the Y direction when the display 114 floats towards the top or bottom of the housing wall 138, and in the Z direction (into and out of the page in FIG. 3) when the display 114 floats towards the front cover 132 or back cover 136. Again, the shock mounts 152 are non-hysteretic, and therefore they bend back to their original position when the force is removed.

Described another way, the shock mounts 152 hold the LCD display 114 in space in 6 degrees of freedom, while allowing the display some freedom to move in order to transfer energy away from the fragile display. The concept of DOF (degrees of freedom) refers to the number of independent coordinates required to define its position. As is generally well known, a rigid body in three dimensions has six degrees of freedom. For example, 3 linear positions, e.g., represented by points along the X-axis, Y-axis and Z-axis, and 3 rotational positions represented by the angles θx, θy and θz, which are the rotational positions of the rigid body about the X-axis, Y-axis and Z-axis respectively.

As shown in FIGS. 2 & 3, the shock mount assembly 150 generally includes multiple (e.g., four) shock mounts 152 that are spaced apart along the outer periphery of the display 114. The multiple shock mounts 152 work together to provide both linear and rotational rigidity while allowing the display 114 the ability to transfer its energy thereto. In most cases, the shock mount assembly 150 includes a pair of spaced apart compliant shock mounts 152 that are disposed on opposing sides of the display 114 to provide DOF rigidity. In the illustrated embodiment, a first set of shock mounts 152A are attached to a first side 153 of the LCD display 114, and a second set of shock mounts 152B are attached to a second side 154 of the LCD display 114. The first side 153 is positioned opposite the second side 154. When placed in these positions, the compliant shock mounts 152 are oriented parallel to both the top and bottom of the display 114. As should be appreciated, placing the shock mounts 152 on the side of the display 114 is easier than on the top and bottom of the display 114 because of the hinge mechanism that is typically located on the bottom of the display 114. It should be appreciated, however, that this is not a limitation and that the position and orientation of the shock mounts 152 may vary according to the specific design of each assembly. It should also be appreciated that using four shock mounts is not a limitation and that more or less may be used so long as they provide DOF rigidity.

Referring to FIG. 4, the shock mounts 152 will be described in greater detail. As shown, the shock mount 152 is disposed between the housing wall 138 and the LCD frame 148. The shock mount 152 generally includes two elements—a longitudinal compliant member or grommet 155, and a longitudinal fastening device 156. The compliant member 155 includes a first segment or collar 157 and a second segment 158. The outer periphery of the first segment 157 is larger than the outer periphery of the second segment 158. The first segment 157 is disposed between the LCD frame 148 and the housing wall 138 and the second segment 158 is disposed inside a mounting hole 160 in the housing wall 138.

Broadly, the first segment 157 fills a gap 161 formed between the LCD frame 148 and housing wall 138, and the second segment 158 fills the space formed by the mounting hole 160. More specifically, a distal end 162 of the first segment 157 abuts to the peripheral side portion 149 of the LCD frame 148 and a proximal end 163 of the first segment 157 abuts to an inner side 164 of the housing wall 138. In addition, an outer periphery 165 of the second segment 158 abuts to an inner periphery 166 of the mounting hole 160 of housing wall 138. In most cases, the LCD display 114 is not structurally fixed to the LCD housing 118, but rather rests inside the LCD housing 118, i.e., the LCD housing 118 supports the shock mount 152, and thus the LCD display 114. It is generally desirable to have the segments 157, 158 tightly held (but not too tight) by the adjacent surfaces 149, 164, 166.

The shock mount 152 also includes a through hole 167 for receiving the fastening device 156. As shown, the through hole 167 extends through the shock mount 152. The fastening device 156 includes a first portion 168 that is adapted to mate with the through hole 167 and a second portion 169 that is adapted to mate with the LCD frame 148. In the illustrated embodiment, the fastening device 156 is a screw that is threadably coupled to the LCD frame 148, i.e., the second portion 169 represents a threaded element for coupling to a threaded receiving element positioned on the LCD frame 148. In addition, the first portion 168 is sized to snugly fit inside the through hole 167, i.e., the outer periphery of the first portion abuts to the inner periphery of the through hole. As such, the first portion 168, which is fixed to the LCD display, is going to hit the compliant member 155 and compress it whenever a force causes the display to move.

In most cases, the compliant member 155 is formed from a suitable complaint material such as an elastomer (sufficiently rigid but pliable), and the fastening device 156 is formed from a suitable rigid material such as steel. It should be understood, however, that these materials are not a limitation and that other suitable materials may be used. For example, the compliant member may be formed from rubber, silicone, soft plastics and the like.

Figure 5:
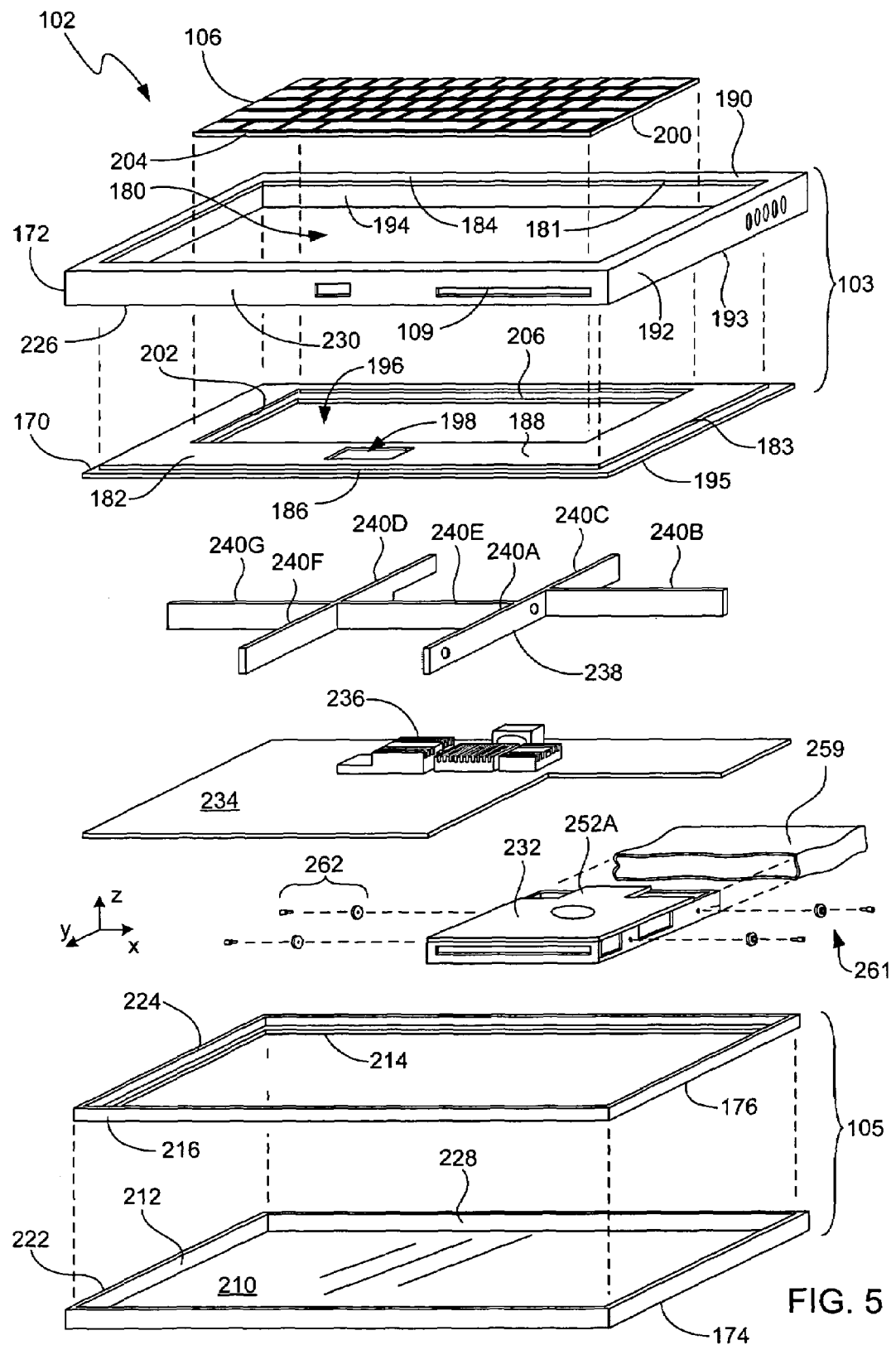
FIG. 5 is a broken away perspective diagram of a base of a portable computer, in accordance with one embodiment of the present invention.

FIG. 5 is a broken away perspective diagram of the base 102 including the top case 103 and the bottom case 105, in accordance with one embodiment of the present invention. As shown, the top case 103 generally includes a top plate 170 and a top frame 172, and the bottom case 105 generally includes a bottom plate 174 and a bottom frame 1.76. The top frame 172 is arranged to structurally support the periphery of the top plate 170 while the bottom frame 176 is arranged to structurally support the periphery of the bottom plate 174. In the illustrated embodiment, the top and bottom plates 170, 174 are formed from a suitable shielding material and the top and bottom frames 172, 176 are formed from a suitable plastic material. By way of example, the top and bottom plates 170, 174 may be formed from titanium sheet metal and the top and bottom frames 172, 176 may be formed from a carbon fiber filled plastic. As should be appreciated, titanium sheet metal provides great electronic shielding while increasing the strength and reducing the weight of the portable computer 100 (e.g., titanium is stronger than steel, but lighter than aluminum). In addition, carbon fiber plastic provides a rigid structure that is both strong and light. Moreover, both titanium and carbon fiber plastic are thermally conductive. In one embodiment, the inner surfaces of the frames 172, 176 are selectively coated with a conductive layer so as to shield the remaining portions of the base 102. By way of example, the inner surfaces of the frames 172, 176 may be selectively plated with a Nickel or Nickel-Copper material.

It should be noted that the above elements are not a limitation and that they may vary according to the specific needs of each enclosure. For example, steel sheet metal may be used to form the top and bottom plates, and the top and bottom frames may be formed from other materials including polycarbonate. Moreover, the conductive layer may be applied by coating, painting, depositing and/or the like. Additionally, the conductive layer may be formed from other suitable materials or coatings such as silver. As should be appreciated, the thickness of the conductive layer may vary (larger or smaller) according to the type of material used and the method for applying the material.

During assembly, the top plate 170 is structurally bonded to the top frame 172 and the bottom plate 174 is structurally bonded to the bottom frame 176. In one embodiment, an adhesive is used to attach the top frame 172 to the top plate 170 and to attach the bottom frame 176 to the bottom plate 174 so as to form a singular composite top case 103 and a singular composite bottom case 105. In one implementation, the adhesive is a glue that is compliant when dispensed and then cures to a rigid structure over time. The glue is preferably configured to exhibit good strength characteristics and good adhesion between the top frame 172 and the top plate 170 and between the bottom frame 176 and the bottom plate 174. The glue is also configured to reduce tolerance variability in the overall geometry of the top and bottom cases 103, 105.

In addition, the top plate 170 is electrically bonded to the top frame 172 and the bottom plate 174 is electrically bonded to the bottom frame 176. In one embodiment, a conductive paste is used to attach the top frame 172 to the top plate 170 and to attach the bottom frame 176 to the bottom plate 174 so as to electrically seal the interfaces therebetween. The conductive paste preferably exhibits good electrical characteristics and good adhesion between the conductive layer disposed on the inner surfaces of the frames and the top and bottom plates 170, 174. Like the glue, the conductive paste generally has two states—a compliant state and a rigid state. By way of example, techniques for structurally and electrically gluing a frame to a plate may be found in U.S. patent application Ser. No. 09/821,784 entitled "COMPUTER ENCLOSURE," filed on Mar. 28, 2001, which is herein incorporated by reference.

To elaborate further, the top plate 170 is configured for placement within the top frame 172. The top frame 172 includes a plate opening 180 for receiving a raised portion 182 of the top plate 170, and a flange portion 184 for receiving a first recessed portion 186 of the top plate 170. For example, the shape of the plate opening 180 typically coincides with the shape of the raised portion 182. In one embodiment, the opening 180 has an inner peripheral surface 181 that is configured to substantially mate with an outer peripheral surface 183 of the raised portion 182 when the raised portion 182 is placed within the opening 180. In another embodiment, a top surface 188 of the top plate 170 is configured to be flush with a top surface 190 of the top frame 172 when the raised portion 182 of the top plate 170 is placed within the plate opening 180 of the top frame 172 (as shown in FIG. 1).

The top frame 172 also includes a wall portion 192 that extends below the flange portion 184. As shown, the outer periphery 193 of the wall portion 192 makes up a portion of the exterior of the base 102 while the inner periphery 194 of the wall portion 192 is configured to surround the outer periphery 195 of the recessed portion 186 when the top plate 170 is placed within the top frame 172. The wall portion 192 includes various openings for providing access to components of the portable computer 100. For example, a front of the top frame 172 generally includes a drive opening 109 for allowing access to a disk drive such as a floppy, zip, CD or DVD drive, and the sides of the top frame 172 generally include vent structures 111 for allowing the passage of air.

Further still, the raised portion 182 includes a keyboard opening 196 and a track pad opening 198. The keyboard opening 196 is adapted for receiving the movable keyboard 106, and the track pad opening 198 is adapted for receiving the stationary track pad 108 and button(s) 110. As mentioned, the keyboard opening 196 is arranged to allow access to various internal components of the portable computer 100 when the movable keyboard 106 is moved away from the opening 196. By way of example, the opening 196 may allow an operator of the portable computer 100 to upgrade internal components such as a modem, memory, hard drive and/or the like.

The movable keyboard 106 generally includes a base plate 200, which is arranged to support a plurality of keys, and which is configured for placement within the opening 196. For example, the shape of the opening 196 typically coincides with the shape of the base plate 200. In one embodiment, the opening 196 has an inner periphery 202 that is configured to mate with an outer periphery 204 of the base plate 200 when the keyboard 106 is placed within the opening 196. The top plate 170 also includes a recessed lip 206 for supporting a bottom edge of the base plate 200 when the movable keyboard 106 is placed within the opening 196. As shown, the lip 206 extends into the opening 196 past the inner periphery 202 of the opening. In most cases, the recessed lip 206 is configured to position a top surface of the base plate 200 substantially flush with a top surface of the base 102 (as shown in FIG. 1).

To elaborate even further, the bottom frame 176 is configured for placement within the bottom plate 174. The bottom plate 174 includes a bottom surface 210 and a bottom plate wall 212 extending upwards therefrom. The bottom surface 210 is arranged for receiving a flange portion 214 of the bottom frame 176, and the bottom plate wall 212 is arranged for receiving a bottom frame wall 216 extending upwards from the flange portion 214. The outer periphery of the bottom frame wall 216 is arranged to substantially coincide with the inner periphery of the bottom plate wall 214. Furthermore, a top surface 222 of the bottom plate wall 212 is configured to extend above the peripheral edge 224 of the bottom frame wall 216 when the bottom frame 176 is attached to the bottom plate 174.

In their assembled condition (as shown in FIG. 1), the top and bottom cases 103, 105 are arranged to electrically and mechanically couple to one another so as to form a box like structure (e.g., base 102) that encloses various internal components. In most cases, for example, the top and bottom cases 103, 105 are adapted for engagement and coupled to one another via a fastening device. In one embodiment, the peripheral edges of the top case are adapted to mechanically and electrically engage the peripheral edges of the bottom case, and a plurality of screws are used to hold the two cases 103, 105 together. In the illustrated embodiment, the top surface 224 of the bottom frame wall 216 is arranged to interface with a bottom surface 226 of the top frame wall 192, and an inner edge 228 of the bottom plate wall 212 is arranged to interface with an outer portion 230 of the top frame wall 192. By way of example, the top surface 224 of the bottom frame wall 216 may include a slot for receiving a hook disposed on the bottom surface 226 of the top frame wall 192. When mated, the combined walls 212, 230 preferably form an outer wall that is substantially flush or planar, i.e., no lips.

As shown in FIG. 5, the internal components, which are enclosed by the top case and bottom cases 103, 105, may include a CD/DVD drive 232, a printed circuit board 234, a heat transfer system 236, and a rib chassis 238. It should be understood, however, that these components are not a limitation, and are only shown to simplify discussion and to further describe various embodiments of the invention. The CD/DVD drive 232 is configured for accepting a CD or DVD disc onto which data can be stored or retrieved. The printed circuit board 234 (e.g., motherboard) is configured for carrying a plurality of integrated circuits associated with operating the portable computer. The heat transfer system 236, which is attached to the printed circuit board 234, is configured for cooling the integrated circuits and other electronic components. The rib chassis 238 is configured for supporting the base 102 and some internal components housed within the base 102. The components 232-238 are generally disposed between the top case 103 and the bottom case 105, and more particularly between the top and bottom frames 172, 176 and the top and bottom plates 170, 176. For example, the top frame 172 and bottom plate and frame 174, 176 provide walls for surrounding the components 232-238, and the top plate 170 and bottom plate 174 provide surfaces for covering the components 232-238.

The rib chassis 238 generally includes a plurality of ribs 240 that are attached to the base 102. For example, the ribs 240 may be attached to the top case 103 and bottom case 105 via a plurality of screws, slots and/or adhesives. In most cases, the ribs 240 extend in multiple directions so as to support the base 102 and to define open areas inside the base 102 for placement of the internal components. By way of example, the ribs 240 may define a modem area, a PC card area, a RAM area, a heat transfer system area, a CD/DVD drive area, and/or the like. The rib chassis 238 may also serve to reduce electronic emissions emanating from within each of these areas. For example, the rib chassis may be formed from a carbon fiber plastic and have a conductive layer applied thereto. The printed circuit board 234 is typically attached to the rib chassis 238. By way of example, the printed circuit board 234 may be attached to the ribs 240 via a plurality of screws, slots and/or adhesives. The CD/DVD drive 232 is generally attached to the base 102 and the rib chassis 238. As shown, the printed circuit board 234 includes a cut out portion for allowing the CD/DVD drive 232 to be placed between the ribs 240 of the rib chassis 238 and the walls 192 of the top frame 172 so as to cooperatively position the CD/DVD drive 232 relative to the opening 109.

In accordance with one aspect of the present invention, an enclosureless CD/DVD drive is installed into the base. By enclosureless, it is meant that the CD/DVD drive does not include its own housing and thus it is thinner, lighter and cheaper than conventional CD/DVD drives. Although a housing is not included, the enclosureless CD/DVD drive does include drive components and frame components. The drive components typically consist of a laser, light sensing diode, and a spindle motor, and the frame components typically consist of structural members that support the drive components. The frame components typically take the form of a skeletal system and therefore there are many openings surrounding the drive components. Unfortunately, these openings allow the passage of undesirable electronic emissions and unwanted loose particles (dust). Portions of the base are thus configured to house the enclosureless CD/DVD drive. For instance, portions of the top case, bottom case, and rib chassis may be configured to form a CD/DVD drive housing inside the base that can shield the enclosureless CD/DVD drive from internal and external hazards. That is, the top case, bottom case, and rib chassis may form an enclosed region that surrounds a substantial portion of the enclosureless CD/DVD drive.

Figure 6:
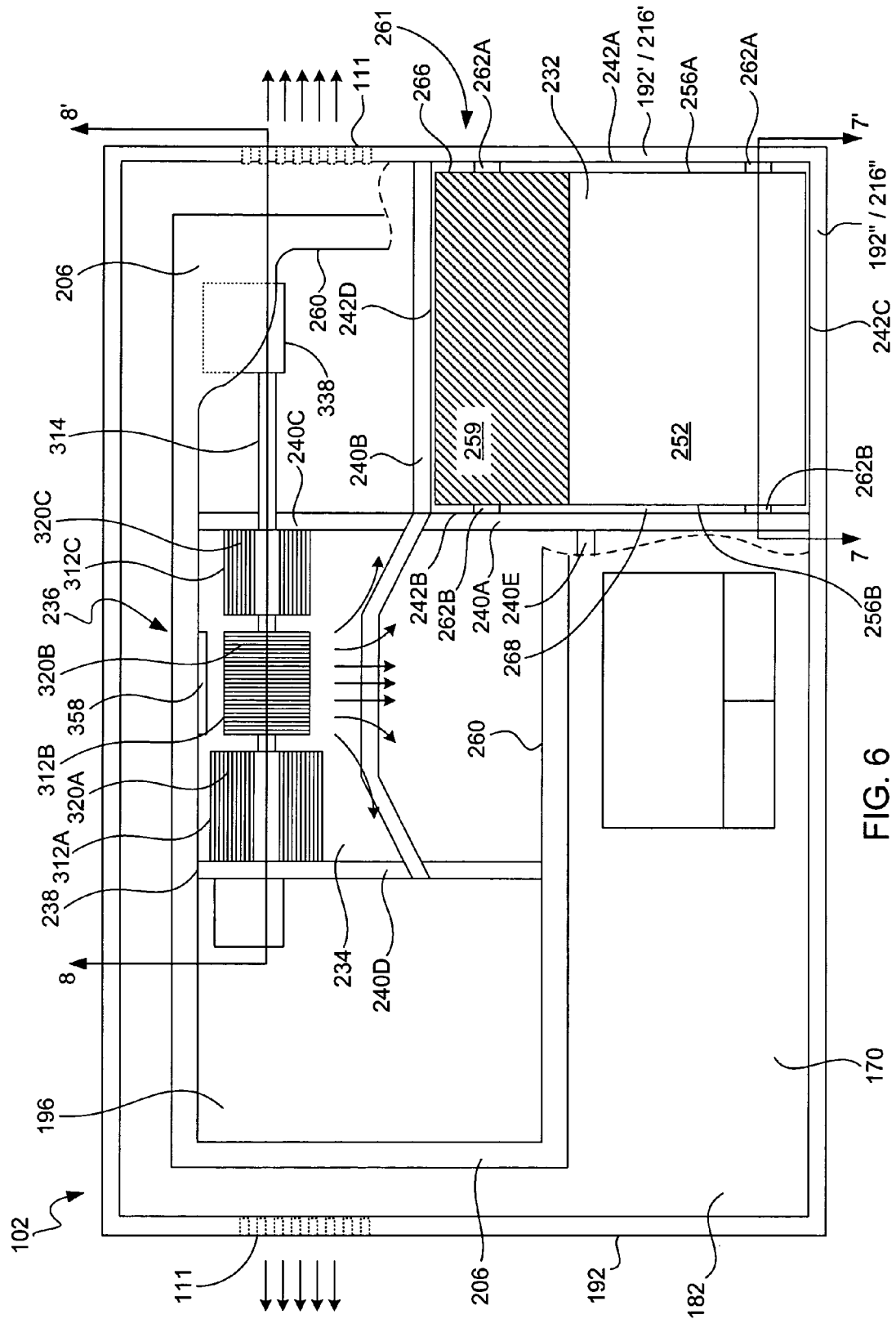
FIG. 6 is a top view, with a removed section, of a base of a portable computer, in accordance with one embodiment of the present invention.

Referring to FIGS. 5-7, an enclosureless CD/DVD drive 232 is housed within the base 102. More particularly, the top case 103, bottom case 105 and rib chassis 238 are configured for enclosing the enclosureless CD/DVD drive 232 therebetween so as to surround the peripheral regions of the drive 232. In the illustrated embodiments, the internal enclosure 242 includes a first side wall 242A for covering a first side 244 of the drive 232, a second side wall 242B for covering a second side 246 of the drive 232, a front wall 242C for covering a front side of the drive 232, a back wall 242D for covering a back side of the drive 232, a top wall 242E for covering a top side of the drive 232, and a bottom wall 242F for covering a bottom side of the drive 232. As should be appreciated, the first side wall 242A is formed by a combination of the top frame wall 192' and the bottom frame wall 216', the second side wall 242B is formed by a first rib 240A, the front wall 242C is formed by a combination of the top frame wall 192" and the bottom frame wall 216", the back side wall 242D is formed by a second rib 240B, the top wall 242E is formed by the top plate 170 (removed portion in FIG. 6), and the bottom wall 242F is formed by the bottom plate 174.

As shown in FIG. 6, the first side wall 242A and the front wall 242C are a continuous section of the top and bottom frame walls 192/216, and the second side wall 242B and the back side wall 242D are a continuous section of the rib chassis 238. The rib 240A is configured to abut to the top and bottom frame walls 192/216" to seal the interface between front wall 242C and the second side wall 242B, and the rib 240B is configured to abut to the top and bottom frame walls 192/216' to seal the interface between the back wall 242D and the first side wall 242A. As shown in FIG. 7, the top plate 170 is configured to abut to the top surface of the top frame wall 192 and the rib 240A to seal the interface between the walls 242A-D and the top wall 242E, and the bottom plate 174 is configured to abut to the bottom surface of the bottom frame wall 216 and the rib 240A to seal the interface between the walls 242A-D and the bottom wall 242F. Accordingly, all of the sides of the enclosureless CD/DVD drive 232 are enclosed when the enclosureless CD/DVD drive 232 is assembled inside the base 102.

Referring to FIGS. 5-7, the enclosureless CD/DVD drive 232 is configured for placement within the base 102 and more particularly between portions of the top case 103, bottom case 105 and rib chassis 238. The enclosureless CD/DVD drive 232 generally includes a frame component 248 having a base member 250 and a top cover 252. The base member 250 is configured for structurally supporting the sensitive components of the drive 232 and the top cover 252 is configured for covering the sensitive components of the drive 232. By way of example, the cover 252 may be arranged to block the passage of light emanating from the laser of the drive. The base member 250 generally includes a base portion 254 and side portions 256 extending therefrom. The side portions 256 include a flange portion 258 for receiving the bottom surface of the cover 252. In some cases, the flange portions 258 include a threaded receptacle for receiving a screw so as to attach the cover 252 to the base member 250. Although the base member 250 and cover 252 surround the periphery of the drive components, the combination of the base member 250 and cover 252 leaves a plurality of openings therebetween. This is generally done to reduce the overall weight of the drive 232. In one embodiment (as shown in FIG. 5), the cover 252 includes an extension 252A for covering the moving laser underneath (typically this is not done because conventional drives have an enclosure that already serves this function). As should be appreciated, it is generally desirable to block laser light from emanating outside the drive so as to meet computer standards. In one implementation, the base member 250 is formed from suitable material such as stainless steel and the cover 252 is formed from a suitable material such as aluminum.

In one embodiment (as shown in FIGS. 5 & 6), a thin flexible sheath 259 may be used to surround at least a portion of the enclosureless CD/DVD drive 232 to further prevent dust and loose particles from reaching the drive components of the enclosureless CD/DVD drive 232. For instance, there may be portions of the internal enclosure 242 that are left unsealed and therefore unwanted particles may enter therethrough. By way of example, a portion of the CD/DVD drive 232 may extend into the region below the keyboard opening 196. As such, when the keyboard 106 is removed, an open pathway to the enclosureless CD/DVD drive 232 may exist. Therefore, in one implementation, the flexible sheath 259 is configured to cover portions of the enclosureless CD/DVD drive 232 that are left exposed. For example, referring to FIG. 6, the flexible sheath 259 may be configured to extend to a point beyond an edge 260 of the keyboard opening 196 so as to prevent particles from reaching the enclosureless CD/DVD drive 232. The flexible sheath 259 is generally sized to fit over the base member 250, cover 252 and side portions 256 of the drive 232 so as to cover exposed parts of the sides, top, bottom and backside of the drive 232. The thin flexible sheath may be formed from a suitable material such as plastic. By way of example, a polyester film such as MYLAR may be used. It should be noted, however, that this is not a limitation and that other materials may be used.

In accordance with one aspect of the present invention, the CD/DVD drive 232 is shock mounted to the structural members associated with the base 102 in order to protect the CD/DVD drive 232 from forces that may be induced on the portable computer 100. By shock mounted, it is meant that the CD/DVD drive 232 is held in a fixed position while absorbing shocks thereto. As mentioned, the CD/DVD drive 232 is a fragile component of the portable computer 100. As such, it is very important to protect the CD/DVD drive 232 from forces, which may distort, stress or break the sensitive components of the CD/DVD drive 232. By way of example, the forces may be due to impacts on the base 102 during transportation of the portable computer 100. A shock mount assembly is thus provided to hold the CD/DVD drive 232 and to absorb forces acting on the drive 232 so as to reduce stresses on the CD/DVD drive 232. In general, the shock mount assembly allows the CD/DVD drive 232 to float relative to the base 102, and cushions the movements of the floating CD/DVD drive 232, i.e., the assembly prevents the drive 232 from running into an adjacent surface such as the top/bottom cases 103, 105 and rib chassis 238.

Referring to FIGS. 5-7, a shock mount assembly 261 is arranged to support the CD/DVD drive 232 relative to the base 102. Broadly, the shock mount assembly allows the drive to transfer a load into the most structural sound place in the base, i.e., the top case, bottom case and rib chassis. More particularly, the shock mount assembly 261 provides a non-hysteretic way of supporting the CD/DVD drive 232 relative to the structural components of the base 102, i.e., the rib chassis 238 and the top frame wall 192. By non-hysteretic, it is meant, for example, that the shock mount assembly 261 may be altered by an external force while having the ability to return to its original non-altered configuration when the altering force is removed. By way of example, the external force may be caused by an impact to the top or bottom cases 103, 105. Accordingly, the CD/DVD drive 232 is held in manner that does not distort the CD/DVD drive 232. That is, the CD/DVD drive 232 is moved (albeit limited) without causing distortions.

To elaborate further, the shock mount assembly 261 includes a plurality of compliant shock mounts 262 that are structurally attached to the CD/DVD drive 232 and cooperatively attached to both the rib 240A and the top and bottom frame walls 192'/216'. The compliant shock mounts 262 are generally arranged to restrain the drive 232 in the X, Y and Z directions. The compliant shock mounts 262 are disposed between the inner periphery of the top frame wall 192' and the outer periphery of the CD/DVD drive 232 as well as between the inner periphery of the rib 240A and the outer periphery of the CD/DVD drive 232. By placing the compliant shock mounts 262 between the drive and the top frame wall and rib, the shock mounts 262 can compress to compensate for undesirable forces inflicted on the drive. That is, the compliant shock mount are arranged to decelerate the floating CD/DVD drive 232 (if it accelerates too fast it can be damaged). By way of example, the shock mounts 262 tend to compress in the X direction when the drive 232 floats towards the rib 240A or top frame wall 192', in the Y direction when the drive 232 floats towards the rib 240B or top frame wall 192", and in the Z direction when the drive 232 floats towards the bottom plate 174 or top plate 170. Again, the shock mounts 262 are non-hysteretic, and therefore, they bend back to their original position when the force is removed.

Described another way, the shock mounts 262 hold the CD/DVD drive 232 in space in 6 degrees of freedom, while allowing the display some freedom to move in order to transfer energy away from the sensitive components of the drive. As previously mentioned, DOF (degrees of freedom) refers to the number of independent coordinates required to define its position. As is generally well known, a rigid body in three dimensions has six degrees of freedom. For example, 3 linear positions, e.g., represented by points along the X-axis, Y-axis and Z-axis, and 3 rotational positions represented by the angles θx, θy and θz, which are the rotational positions of the rigid body about the X-axis, Y-axis and Z-axis respectively.

As shown in FIGS. 5-7, the shock mount assembly 261 generally includes multiple (e.g., four) shock mounts 262 that are spaced apart along the outer periphery of the drive 232. The multiple shock mounts 262 work together to provide both linear and rotational rigidity while allowing the drive 232 the ability to transfer its energy thereto. In most cases, the shock mount assembly 261 includes a pair of spaced apart compliant shock mounts 262 that are disposed on opposing sides of the drive 232 to provide DOF rigidity. In the illustrated embodiment, a first set of shock mounts 262A are attached to a first side 266 (or A side) of the drive 232, and a second set of shock mounts 262B are attached to a second side 268 (or B side) of the drive 232. The first side 266 is positioned opposite the second side 268. When placed in these positions, the compliant shock mounts 262 are oriented parallel to both the front and back of the drive 232. As should be appreciated, placing the shock mounts 262 on the side of the drive 232 is easier than on the front and back of the drive 232 because of the opening 109 required to accept the CD/DVD disc. It should be appreciated, however, that this is not a limitation and that the position and orientation of the shock mounts 262 may vary according to the specific design of each assembly. It should also be appreciated that using four shock mounts is not a limitation and that more or less may be used so long as they provide DOF rigidity.

Figure 7A:
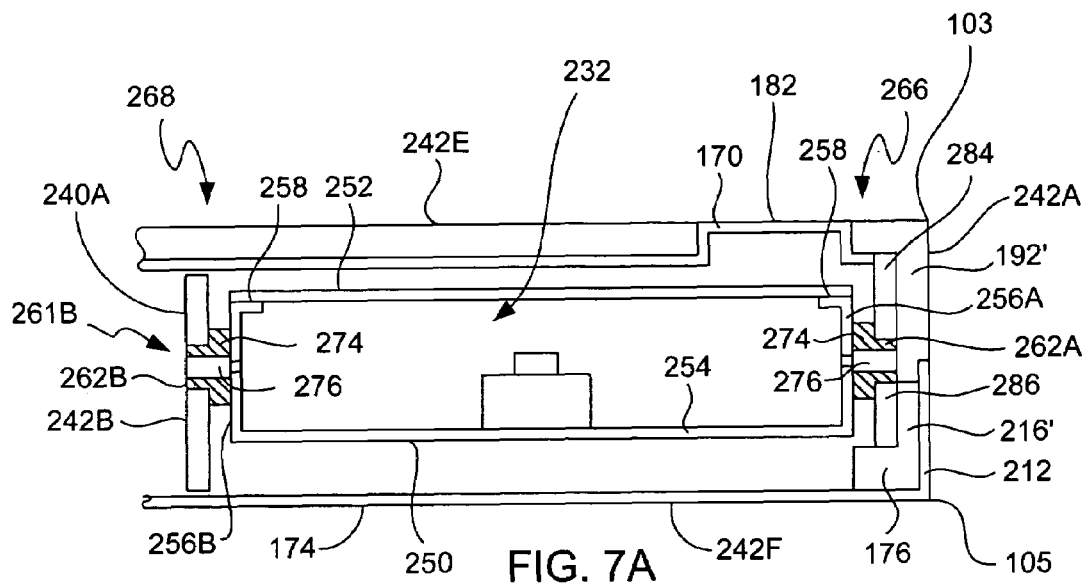
FIGS. 7A-C are a side elevation views, in cross section (taken along 7-7' as indicated in FIG. 6), of a shock mount assembly used to support a CD/DVD drive in a base of a portable computer, in accordance with one embodiment of the present invention.
Figure 7C:
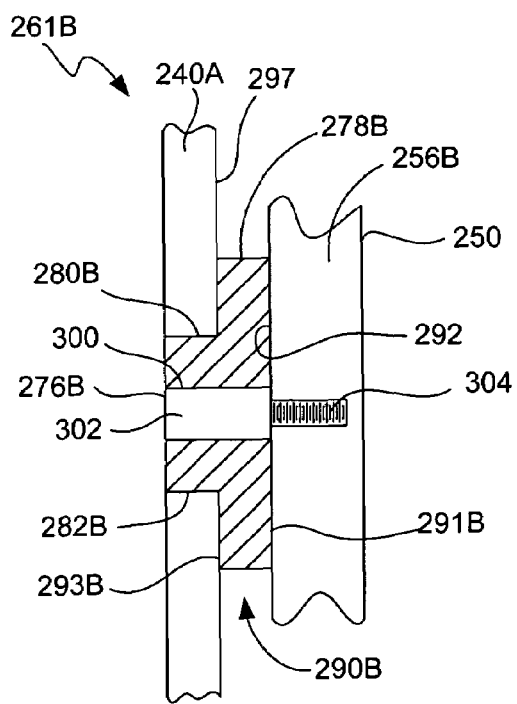
Figure 7B:
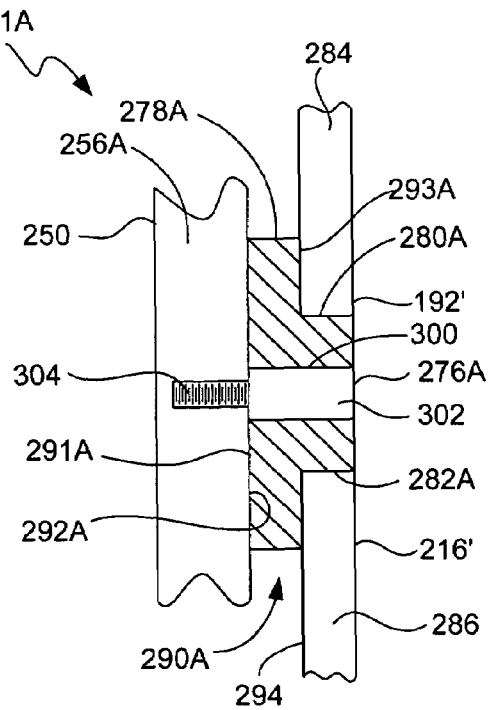

Referring to FIGS. 7A-C, the shock mounts 262 will be described in greater detail. As shown, the first set of shock mounts 262A are disposed between the top/bottom frame wall 192/216' and a first side portion 256A of the base member 250, and the second set of shock mounts 262B are disposed between the rib 240A and a second side portion 256B of the base member 250. Like the shock mounts described previously, each of the shock mounts 262 include two elements—a longitudinal compliant member or grommet 274, and a longitudinal fastening device 276.

Referring to both FIGS. 7B & 7C, the compliant member 274 includes a first segment 278 and a second segment 280.

The outer periphery of the first segment 278 is larger than the outer periphery of the second segment 280.

As shown in FIG. 7B, on the first side of the drive 232, the first segment 278A is disposed between the frame walls 192/216' and the first side portion 256A, and the second segment 280A is disposed inside a mounting hole 282A defined by the frame walls 192/216'. In the illustrated embodiment, the top frame wall 192' includes a first mounting bracket 284, and the bottom frame wall 216' includes a second mounting bracket 286. In most cases, a bottom portion of the first mounting brackets is arranged to cooperate with a top portion of the second mounting bracket to form the mounting hole 282A. By way of example, both the bottom and top portions may include a cut out portion that when combined form the shape of the mounting hole 282A.

Broadly, the first segment 278A fills a gap 290A formed between the frame walls 192/216' and the first side portion 256A, and the second segment 280A fills the space formed by the mounting hole 282A. More specifically, a distal end 291A of the first segment 278A abuts to an outer surface 292A of the first side portion 256A and a proximal end 293A of the first segment 278A abuts to an inner side 294 of the frame walls 192/216'. In addition, an outer periphery of the second segment 280A abuts to an inner periphery of the mounting hole 282A of the frame walls 192/216'. As such, the drive 232 is not structurally fixed to the frame walls 192/216', but rather rests inside the frame walls 192/216', i.e., the frame walls 192/216' supports the shock mount 262A, and thus the drive 232. It is generally desirable to have the segments tightly held (but not too tight) by the adjacent surfaces 291, 294.

As shown in FIG. 7C, on the second side of the drive 232, the first segment 278B is disposed between the rib 240A and the second side portion 256B, and the second segment 280B is disposed inside a mounting hole 282B in the rib 240A. Broadly, the first segment 278B fills a gap 290B formed between the rib 240A and the second side portion 256B, and the second segment 280B fills the space formed by the mounting hole 282B. More specifically, a distal end 291B of the first segment 278B abuts to an outer surface 292B of the second side portion 256B and a proximal end 293B of the first segment 278 abuts to an inner side 297 of the rib 240A. In addition, an outer periphery of the second segment 280B abuts to an inner periphery of the mounting hole 282B of the rib 240A. As such, the drive 232 is not structurally fixed to the rib 240A, but rather rests inside the rib 240A, i.e., the rib 240A supports the shock mount 262B, and thus the drive 232. Again, it is generally desirable to have the segments tightly held (but not too tight) by the adjacent surfaces 291, 297.

The shock mounts 262 also includes a through hole 300 for receiving the fastening device 276. As shown, the through hole 300 extends through the shock mount 262. The fastening device 276 includes a first portion 302 that is adapted to mate with the through hole 300 and a second portion 304 that is adapted to mate with the base member 250. In the illustrated embodiment, the fastening device 276 is a screw that is threadably coupled to the base member 250, i.e., the second portion 304 represents a threaded element for coupling to a threaded receiving element positioned on the base member 250. In addition, the first portion 302 is sized to snugly fit inside the through hole 300, i.e., the outer periphery of the first portion abuts to the inner periphery of the through hole. As such, the first portion 302, which is fixed to the CD/DVD drive, is going to hit the compliant member 274 and compress it whenever a force causes the drive to move.

In most cases, the compliant member 274 is formed from a suitable complaint material such as an elastomer (sufficiently rigid but pliable), and the fastening device 276 is formed from a suitable rigid material such as steel. It should be understood, however, that these materials are not a limitation and that other suitable materials may be used. For example, the compliant member may be formed from rubber, silicone, soft plastics and the like.

In accordance with another aspect of the present invention, a heat transfer system is provided to remove heat from heat producing elements housed within the portable computer. The heat transfer system is generally configured to thermally couple a heat producing element, such as a IC chip, to a structural member of the portable computer so as to dissipate the heat through the structural member, i.e., the heat transfer system sinks heat into the structural member. By way of example, the structural member may be a rib chassis, top case and/or bottom case. As such, the heat transfer system takes advantage of some of the largest heat sink structures found in the portable computer, i.e., structural members such as the rib chassis, top case and/or bottom case provide a large surface area for spreading the undesirable heat.

The heat transfer system generally includes a heat sink device that is thermally coupled to the heat producing element. By way of example, the heat sink device may include a first surface that is in thermal contact with a surface of an IC chip. In one embodiment, the heat sink works with a heat pipe to move the heat from a heat producing element to a structural member. By way of example, the heat pipe may include a first surface that is in thermal contact with the heat sink device and a second surface that is in thermal contact with the structural member. In another embodiment, the heat sink device is positioned thermally adjacent to a structural member so as to move the heat from a heat producing element to the structural member. By way of example, the heat sink device may include a second surface that abuts or is in close proximity to a surface of the structural member. In another embodiment, the heat sink device is thermally integrated with a structural member so as to directly move the heat from a heat producing element to the structural member. By way of example, the heat sink device may be a portion of the structural member having a first surface that is in thermal contact with a surface of an IC chip.

Figure 8:
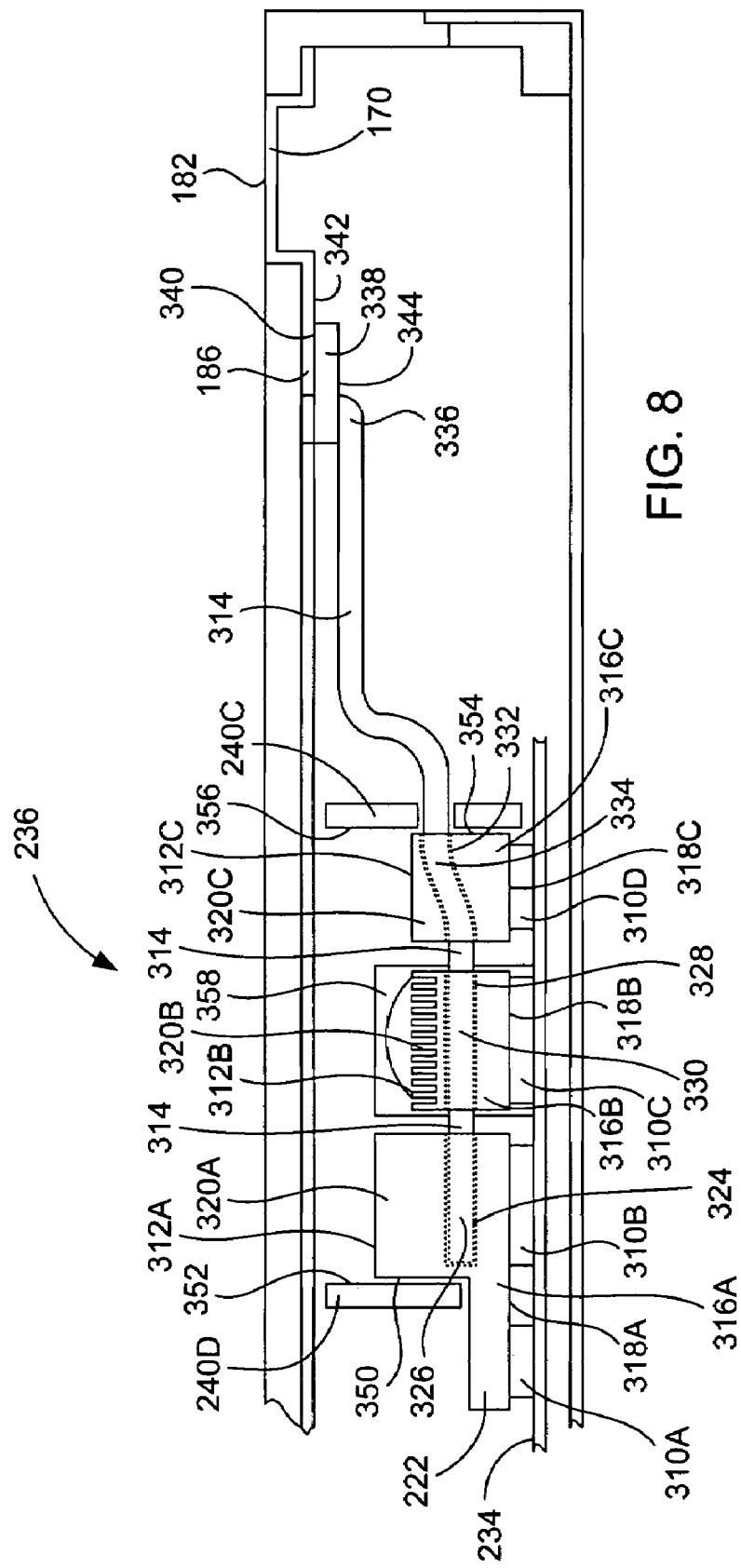
FIG. 8 is a side elevation view, in cross section (taken along 8-8' as indicated in FIG. 6), of a heat transfer system housed with a base of a portable computer, in accordance with one embodiment of the present invention.

Referring to FIGS. 5, 6 and 8, the heat transfer system 236 is arranged to dissipate heat from a plurality of IC chips 310 attached to the printed circuit board 234. As is generally well known, IC chips generate heat and are therefore susceptable to overheating. Overheating may lead to errors in the functionality of the chip. The problem is compounded by the ever increasing speed of IC chips.

The heat transfer system 236 generally includes a plurality of heat sinks 312 thermally coupled to the plurality of chips 310, and a heat pipe 314 thermally coupled between the plurality of heat sinks 312 and the top plate 170 of the top case 103. The heat sinks 312 are arranged to carry heat away from the plurality of chips 310, and the heat pipe 314 is arranged to carry heat away from the heat sinks 312. That is, the heat sink 312 and heat pipe 314 form a thermal path from the IC chips 310 to the top plate 170. As mentioned, the top plate 170 is formed from a thermally conductive material, i.e., sheet metal, and therefore the heat is spread over the entire area of the top plate 170. As should be appreciated, by increasing the surface area, more heat can be dissipated, and thus the portable computer 100 can use "hotter" chips without having to use a bigger fan.

The heat sinks are generally formed from thermally conductive materials such as extruded aluminum. In one implementation, the heat pipe is an evaporation/condensation type heat pipe. Evaporation/condensation type heat pipes generally include an outer copper tube having an evaporation/condensation mechanism disposed therein. It should be understood, however, that this is not a limitation and that other types of heat pipes may be used.

As shown in FIG. 8, the plurality of chips 310 includes a first chip 310A, a second chip 310B, a third chip 310C and a fourth chip 310D. By way of example, the first chip 310A may be a graphics chip, the second chip 310B may be a bridge chip, the third chip 310C may be a processor chip, and the fourth chip 310D may be a cache chip. It should be understood that this is not a limitation and that other types of chips may be used. It should also be noted that a varying number of chips may be used, i.e., one, six, twenty, etc. As shown, each of the IC chips 310 has a heat sink 312 thermally attached thereto. In the illustrated embodiment, a first heat sink 312A is thermally coupled to the first and second chips 310A-B, a second heat sink 312B is thermally coupled to the third chip 310C, and a third heat sink 312C is thermally attached to the forth chip 310D. The heat sinks 312 are generally attached to the chips using conventional techniques. By way of example, a thermal interface material such as thermal grease may be used to attach the heat sinks to the chips.

Each of the heat sinks 312 includes a body 316 having a planar surface 318 that interfaces a top surface of the chip 310, and a plurality of fins 320 extending upwards therefrom. For example, the first heat sink 312A includes a first body 316A, a first planar surface 318A, and first fins 320A. As shown, the first body 316A includes an extended body 322 for connecting to the first chip 310A. As such, the first planar surface 318A interfaces the top surface of the first chip and second chips 310A-B. In addition, the second heat sink 312B includes a second body 316B, a second planar surface 318B and second fins 320B. The second planar surface 318B interfaces the top surface of the third chip 310C. Moreover, the third heat sink 312C includes a third body 316C, a third planar surface 318C and third fins 320C. The third planar surface 318C interfaces the top surface of the fourth chip 310D. In most heat sinks 312, the fins 320 are spaced apart to provide an optimum amount of surface area from which heat can dissipate, i.e., natural convection. As is generally well known, the size, length, number and orientation of the fins can greatly effect the amount of heat dissipated. Although heat sinks with a plurality of straight fins are shown, it should be understood that any type of heat sink device may be used.

Referring to FIGS. 6 & 8, each of the heat sinks 312 is thermally attached to the heat pipe 314. That is, the heat pipe 314 is intimately connected to all of the heat sinks 312 so as to pump heat from the heat sinks 312 into the base 102, and more particularly the top case 103. In the illustrated embodiment, each of the bodies 316A-C includes a heat pipe opening, respectively, for receiving the heat pipe 314 therein. With regards to the first heat sink 312A, the first body 316A includes a heat pipe cavity 324 that is adapted to receive a first end 326 of the heat pipe 314. With regards to the second heat sink 312B, the second body 316B includes a first heat pipe tunnel 328 that is adapted to receive a first longitudinal segment 330 of the heat pipe 314 therethrough. With regards to the third heat sink 312C, the third body 316C includes a second heat pipe tunnel 332 that is adapted to receive a second longitudinal segment 334 of the heat pipe 314 therethrough. When assembled, the first end 326 of the heat pipe 314 is disposed inside the cavity 324, the first longitudinal segment 330 is disposed inside the first tunnel 328, and the second longitudinal segment 334 is disposed inside the second tunnel 332. The heat pipe 314 is typically attached to the heat sinks 312 using conventional techniques. By way of example, the heat pipe 314 can be attached to the heat sinks by soldering, brazing or other similar attachment means.

After exiting the third heat sink 312C, the heat pipe 314 generally extends through a hole in the rib 240C and bends upwards (e.g., elbows) to the top plate 170. In most cases, a second end 336 of the heat pipe 314 is attached to the top plate 170 via an auxiliary plate 338. The auxiliary plate 338 is generally formed from a thermally conductive material such as aluminum, and serves to thermally couple the heat pipe 314 to the top plate 170. As shown, a top surface 340 of the auxiliary plate 338 is attached to an underside 342 of the top plate 170, and the second end 336 of the heat pipe 314 is attached to a bottom surface 344 of the auxiliary plate 338. As such, the heat pipe 314 directs heat to the auxiliary plate 338, and the auxiliary plate 338 directs heat to the top plate 170. The heat pipe 314 is generally attached to the auxiliary plate 338, and the auxiliary plate 338 is attached to the top plate 170 using conventional techniques. By way of example, the heat sink pipe may be attached to the auxiliary plate by soldering, brazing or other similar attachment means, and the auxiliary plate may be screwed or otherwise fastened to the top plate. Thermal grease may be disposed between the auxiliary plate and the top plate to produce a better thermally coupled interface.

It should be understood that this configuration is not a limitation and that other configurations may be used. For example, the heat pipe may be attached directly to the top plate, and may extend below or above the rib. In addition, the heat pipe may extend downwards and attach to the bottom plate. Furthermore, the auxiliary plate may include a channel or cavity for receiving the second end of the heat pipe.

Referring to FIGS. 5, 6 and 8, the heat transfer system 236 is generally disposed in a region of the base 102 defined by the walls of the rib chassis 238 and the top and bottom cases 103, 105. For example, a majority of the heat transfer system 236 may be positioned between the rib 240C and a rib 240D as well as between a rib 240E and the top/bottom frame wall 192/216 of the cases 103, 105. The heat transfer system 236 may also extend into other portions of the base 102. For example, portions of the heat transfer system 236 may extend under, through or over the rib chassis walls, i.e., rib 240C and rib 240D. In the illustrated embodiment, the rib 240D includes a cut away section for allowing the extended base 322 of the first heat sink 312A to pass underneath the rib 240D.

In one embodiment, the heat sinks are also arranged to move heat away from the plurality of chips by being positioned proximate the rib chassis. That is, the position of the heat sink may form a thermal path from the IC chip to the rib chassis. In this embodiment, the rib chassis is formed from a thermally conductive material, and therefore the heat is spread over the entire area of the rib chassis. In one implementation, the thermally conductive material is plastic (e.g., carbon fiber plastic). In another implementation, the thermally conductive material is a metal (e.g., magnesium). In yet another implementation, the thermally conductive material is a composite having both metal and plastic therein.

Referring to FIG. 8, the first heat sink 312A is positioned proximate to the rib 240D, and the third heat sink 312C is positioned proximate to the rib 240C so as to provide a thermal path from the heat sinks 312 to the rib chassis 238. As shown, the first heat sink 312A includes a side surface 350 that is adjacent to an inner surface 352 of the rib 240D, and the third heat sink 312C includes a side surface 354 that is adjacent to an inner surface 356 of the rib 240C. Although the surfaces are shown with a gap therebetween, it should be appreciated that the closer the surfaces are to one another (i.e., abutting), the better the transfer of heat away from the IC chips 310.

The heat transfer system may also include a fan unit for producing an airflow inside the base. Because of the above mention arrangement, i.e., transferring heat to structural members, the fan unit can be a small, low profile and low power consuming device that produces less noise than conventional fans.

As shown in FIG. 6, a fan unit 358 is positioned proximate the heat sinks 312. In general, the fan unit 358 is arranged to pull air from the ambient and into the base 102 in order to send cooling air across the heat sinks 312 thus carrying heat away from the IC chips 310. In the illustrated embodiment, the fan unit 358 is placed behind the second heat sink 312B. This is generally done to force a greater amount of air over the chip (e.g., CPU) that produces the most heat. The configuration of the fins 320 are typically arranged to create optimal air flow between and around the fins. As should be appreciated, the fins 320B of the second heat sink 312B are positioned parallel to the flow of air so that air can readily flow through the fins 320B. After flowing over the second heat sink 312B, the air flow is split into at least two air flow streams. The two air flow streams are directed towards vent structures 111 located on opposing sides of the base 102. The vent structures 111 are generally disposed in the top frame wall 192 of the top case 103, and located towards the rear of the base 102.

Figure 9A:
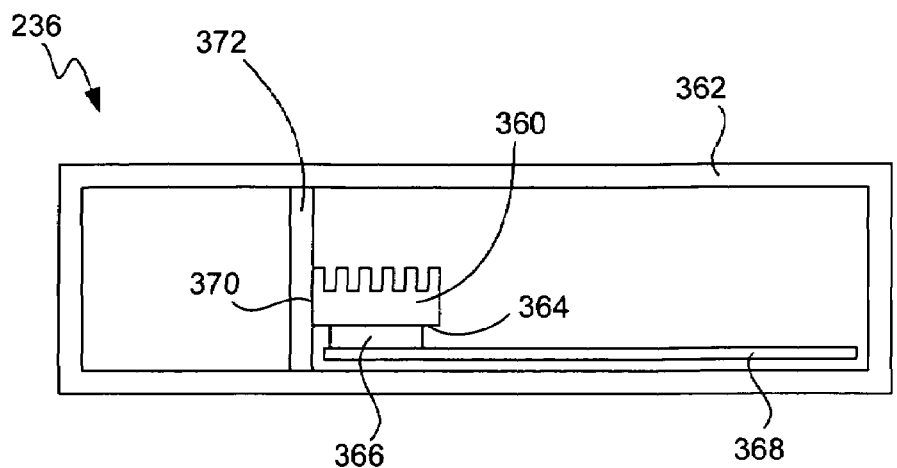
FIGS. 9A-C are simplified side elevation views, in cross section, of a heat transfer system housed with a base of a portable computer, in accordance with alternate embodiments of the present invention.

Turning now to FIG. 9A, an alternative embodiment to the present invention is illustrated wherein the heat transfer system 236 includes a heat sink that is attached to an internal structural member. As shown, the heat sink 360, which is disposed inside a casing 362, includes a first surface 364 that is thermally attached to a chip 366 on a printed circuit board 368, and a second surface 370 that is thermally attached to a rib 372. The heat sink 360 is arranged to carry heat from the chip 366 to the rib 372 so as to dissipate the heat via the surface area of the rib 372. The heat sink 360 is generally attached to the rib 372 using conventional techniques. By way of example, the heat sinks may be attached to the rib by soldering, brazing or other similar attachment means. In addition, the heat sink may be screwed or otherwise fastened to the rib via a fastening device with thermal grease placed therebetween.

Figure 9B:
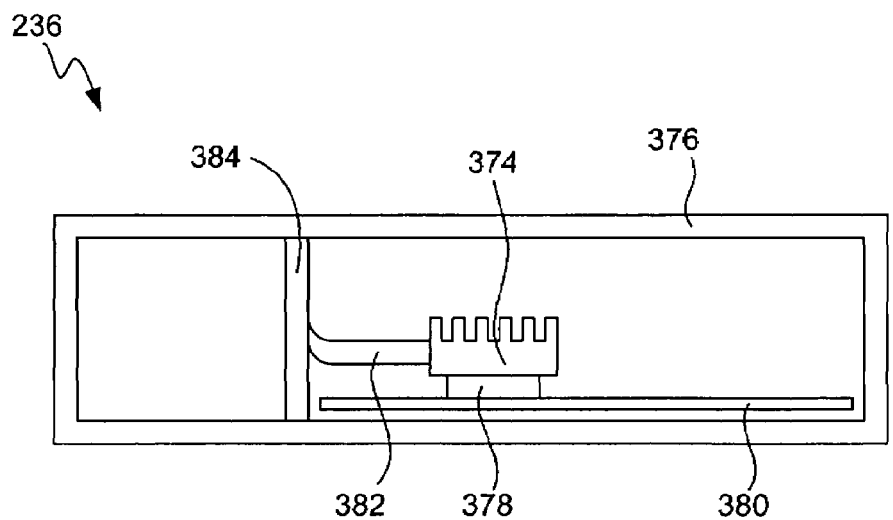

Turning now to FIG. 9B, an alternative embodiment to the present invention is illustrated wherein the heat transfer system 236 includes a heat sink that is attached to an internal structural member via a heat pipe. As shown, the heat sink 374, which is disposed inside a casing 376, is thermally attached to a chip 378 on a printed circuit board 380 and thermally attached to a heat pipe 382. The heat sink 274 is arranged to carry heat from the chip 378 to the heat pipe 382 and the heat pipe 382 is arranged to carry heat from the heat sink 374 to a rib 384 so as to dissipate the heat via the surface area of the rib 384. The heat pipe is generally attached to the heat sink using conventional techniques. By way of example, the heat pipe may be attached to the heat sink by soldering, brazing or other similar attachment means. In addition, the heat pipe is generally attached to the rib using conventional techniques. By way of example, the heat pipe may be attached to the heat sink by soldering, brazing or other similar attachment means, as for example, the heat pipe may be screwed or otherwise fastened to the rib via a fastening device with thermal grease placed therebetween.

Figure 9C:
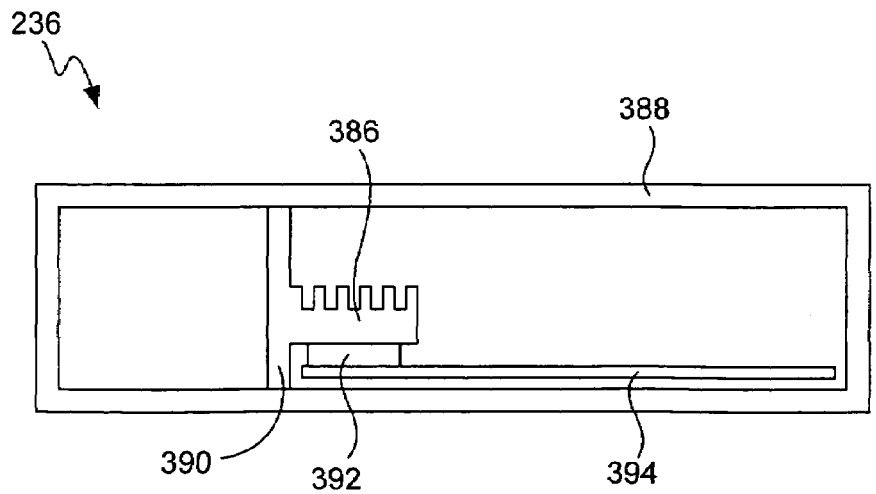

Turning now to FIG. 9C, an alternative embodiment to the present invention is illustrated wherein the heat transfer system 236 includes a heat sink that is integrated with an internal structural member. As shown, the heat sink 386, which is disposed inside a casing 388, is a portion of a rib 390 that extends outwards towards a chip 392. By extending the integrated heat sink 386 outwards, the rib-heat sink can be thermally attached to the chip 392 on a printed circuit board 394. The rib-heat sink is arranged to carry heat from the chip 392 therethrough so as to dissipate the heat via the surface area of the rib 390.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A computing device, comprising:
   an LCD display;
   an LCD housing configured to cover at least a portion of the LCD display;
   a shock mount assembly configured to reduce impacts to the LCD display, and to position the LCD display relative to the LCD housing, the shock mount assembly including a plurality of shock mounts, which are attached to the LCD display, and which rest in a portion of the LCD housing wherein the LCD housing includes a plurality of mounting holes, and wherein each of the plurality of shock mounts includes a resilient member having a first segment and a second segment, the first segment being larger than the second segment, the first segment being disposed between the LCD display and the LCD housing and the second segment being disposed inside one of the mounting holes.

2. The computing device as recited in claim 1 wherein the first segment fills a gap formed between the LCD display and LCD housing, and wherein the second segment fills the mounting hole of the LCD housing.

3. The computing device as recited in claim 2 wherein a distal end of the first segment abuts to a side of the LCD display, a proximal end of the first segment abuts to a side of the LCD housing, and an outer periphery of the second segment abuts to an inner periphery of the mounting hole of the LCD housing.

4. The computing device as recited in claim 1 wherein a first set of shock mounts are attached to a first side of the LCD display, and wherein a second set of shock mounts are attached to a second side of the LCD display, the second side being opposite the first side.

5. The computing device as recited in claim 1 wherein the shock mount assembly holds the LCD display in the X, Y and Z directions.

6. The computing device as recited in claim 1 wherein the LCD display includes an LCD panel and an LCD frame, the LCD frame being attached to the LCD panel and defining the side of the LCD display, and wherein the LCD housing includes a wall that is positioned substantially next to the side of the LCD display so as to form a gap therebetween.

7. The computing device as recited in claim 6 wherein the LCD housing wall includes a plurality of mounting holes, and wherein each of the plurality of shock mounts includes a resilient member having a first segment and a second segment, the first segment being larger than the second segment, the first segment being disposed between the LCD display and the LCD housing and the second segment being disposed inside one of the mounting holes.

8. The computing device as recited in claim 7 wherein a distal end of the first segment abuts to a side of the LCD frame, a proximal end of the first segment abuts to a side of the wall of the LCD housing, and an outer periphery of the second segment abuts to an inner periphery of the mounting hole of the wall of the LCD housing.

9. The computing device as recited in claim 8 wherein the shock mounts include a fastener for attaching the resilient member to the LCD frame.

10. The computing device as recited in claim 9 wherein the fastener is a screw.

11. A computing device, comprising:
a structural component of the computing device;
a sensitive operational component of the computing device; and
a shock mount assembly configured to reduce impacts to the sensitive operation component, and to position the sensitive operation component relative to the structural component, the shock mount assembly including a plurality of shock mounts, which are attached to the sensitive operation component, and which rest in a portion of the structural component wherein the structural component includes a plurality of mounting holes, and wherein each of the plurality of shock mounts includes a resilient member having a first segment and a second segment, the first segment being larger than the second segment, the first segment being disposed between the sensitive operational component and the structural component and the second segment being disposed inside one of the mounting holes.

12. The computing device as recited in claim 11 wherein the first segment fills a gap formed between the sensitive operational component and the structural component, wherein the second segment fills the mounting hole of the structural component, and wherein a distal end of the first segment abuts to a side of the sensitive operational component, a proximal end of the first segment abuts to a side of the structural component, and an outer periphery of the second segment abuts to an inner periphery of the mounting hole of the structural component.

13. The computing device as recited in claim 11 wherein a first set of shock mounts are attached to a first side of the sensitive operational component, and wherein a second set of shock mounts are attached to a second side of the sensitive operation component, the second side being opposite the first side.

14. The computing device as recited in claim 11 wherein the sensitive operational component is a flat panel display.

15. The computing device as recited in claim 11 wherein the structural component is a housing of the computing device, a chassis of the computing device or a combination of the housing and the chassis of the computing device.

16. A computing device, comprising:
an LCD display;
an LCD housing configured to cover at least a portion of the LCD display; and
a shock mount assembly configured to reduce impacts to the LCD display, and to position the LCD display relative to the LCD housing, the shock mount assembly including a plurality of shock mounts, which are attached to the LCD display, and which rest in a portion of the LCD housing wherein the LCD housing includes a plurality of mounting holes, and wherein each of the plurality of shock mounts includes a resilient member having a first segment and a second segment, the first segment being larger than the second segment, the first segment being disposed between the LCD display and the LCD housing and the second segment being disposed inside one of the mounting holes.

17. The computing device as recited in claim 16 wherein the first segment fills a gap formed between the LCD display and LCD housing, and wherein the second segment fills the mounting hole of the LCD housing.

18. The computing device as recited in claim 17 wherein a distal end of the first segment abuts to a side of the LCD display, a proximal end of the first segment abuts to a side of the LCD housing, and an outer periphery of the second segment abuts to an inner periphery of the mounting hole of the LCD housing.

19. The computing device as recited in claim 16 wherein a first set of shock mounts are attached to a first side of the LCD display, and wherein a second set of shock mounts are attached to a second side of the LCD display, the second side being opposite the first side.

20. The computing device as recited in claim 16 wherein the shock mount assembly holds the LCD display in the X, Y and Z directions.

21. The computing device as recited in claim 16 wherein the LCD display includes an LCD panel and an LCD frame, the LCD frame being attached to the LCD panel and defining the side of the LCD display, and wherein the LCD housing includes a wall that is positioned substantially next to the side of the LCD display so as to form a gap therebetween.

22. The computing device as recited in claim 21 wherein the LCD housing wall includes a plurality of mounting holes, and wherein each of the plurality of shock mounts includes a resilient member having a first segment and a second segment, the first segment being larger than the second segment, the first segment being disposed between the LCD display and the LCD housing and the second segment being disposed inside one of the mounting holes.

23. The computing device as recited in claim 22 wherein a distal end of the first segment abuts to a side of the LCD frame, a proximal end of the first segment abuts to a side of the wall of the LCD housing, and an outer periphery of the second segment abuts to an inner periphery of the mounting hole of the wall of the LCD housing.

24. The computing device as recited in claim 16 wherein the shock mounts include a fastener for attaching the resilient member to the LCD frame.

25. The computing device as recited in claim 24 wherein the fastener is a screw.

26. A computing device, comprising:
an LCD display;
an LCD housing configured to cover at least a portion of the LCD display; and
a shock mount assembly configured to reduce impacts to the LCD display, and to position the LCD display relative to the LCD housing, the shock mount assembly including a plurality of shock mounts, which are attached to the LCD display, and which rest in a portion of the LCD housing wherein the LCD display includes an LCD panel and an LCD frame, the LCD frame being attached to the LCD panel and defining the side of the LCD display, and wherein the LCD housing includes a wall that is positioned substantially next to the side of the LCD display so as to form a gap therebetween and wherein the LCD housing wall includes a plurality of mounting holes, and wherein each of the plurality of shock mounts includes a resilient member having a first segment and a second segment, the first segment being larger than the second segment, the first segment being disposed between the LCD display and the LCD housing and the second segment being disposed inside one of the mounting holes.

27. The computing device as recited in claim 26 wherein a distal end of the first segment abuts to a side of the LCD frame, a proximal end of the first segment abuts to a side of the wall of the LCD housing, and an outer periphery of the second segment abuts to an inner periphery of the mounting hole of the wall of the LCD housing.

28. The computing device as recited in claim 26 wherein the shock mounts include a fastener for attaching the resilient member to the LCD frame.

29. The computing device as recited in claim 28 wherein the fastener is a screw.

* * * * *